US009514704B2

(12) United States Patent
Yoon et al.

(10) Patent No.: US 9,514,704 B2
(45) **Date of Patent: *Dec. 6, 2016**

(54) DISPLAY PANEL

(71) Applicant: SAMSUNG DISPLAY CO., LTD., Yongin, Gyeonggi-Do (KR)

(72) Inventors: Soo-Wan Yoon, Hwaseong-Si (KR); Yeong-Keun Kwon, Yongin-Si (KR); Ji-Sun Kim, Seoul (KR); Jong Hee Kim, Hwaseong-Si (KR); Young Wan Seo, Suwon-Si (KR); Jae Keun Lim, Suwon-Si, Gyeonggi-Do (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/805,067

(22) Filed: Jul. 21, 2015

(65) Prior Publication Data

US 2015/0325192 A1 Nov. 12, 2015

Related U.S. Application Data

(63) Continuation of application No. 13/924,221, filed on Jun. 21, 2013, now Pat. No. 9,087,468.

(30) Foreign Application Priority Data

Sep. 28, 2012 (KR) ........................ 10-2012-0108898

(51) Int. Cl.
*G06F 3/038* (2013.01)
*G09G 5/00* (2006.01)
(Continued)

(52) U.S. Cl.
CPC ............ *G09G 5/001* (2013.01); *G09G 3/3266* (2013.01); *G09G 3/3677* (2013.01);
(Continued)

(58) Field of Classification Search
USPC ................ 345/211, 212, 690, 213, 214, 215, 100,345/76, 88; 327/108
See application file for complete search history.

(56) References Cited

U.S. PATENT DOCUMENTS 7,464,312 B2 12/2008 Komatsu
8,941,576 B2 1/2015 Kang et al.
(Continued)

FOREIGN PATENT DOCUMENTS

KR 10-0608975 7/2006
KR 10-2007-0079489 8/2007
(Continued)

OTHER PUBLICATIONS

English Abstract for Publication No. 10-0608975.
(Continued)

*Primary Examiner* — Thuy Pardo
(74) *Attorney, Agent, or Firm* — F. Chau & Associates, LLC

(57) ABSTRACT

A display device includes a display area including a gate line and a data line and a gate driver connected to an end of the gate line, the gate driver including at least one stages integrated on a substrate configured to output a gate voltage, in which the stage includes an inverter unit and an output unit, in which the output unit includes a first transistor and a first capacitor. The first transistor includes an input terminal applied with a clock signal, a control terminal connected to the node Q, and an output terminal connected to a gate voltage output terminal through which the gate voltage is output. An inverter voltage output from the inverter is lower than the low voltage of the gate voltage output by the output unit.

20 Claims, 21 Drawing Sheets

600
CKV
Vss1
400
450
460
CKVB
STVP
Vss2
D1
Dm
G1
Trsw
Cst
Clc
Gn
500
100
300

(51) Int. Cl.
*G09G 3/36* (2006.01)
*G09G 3/32* (2016.01)
*G11C 19/28* (2006.01)

(52) U.S. Cl.
CPC ........... *G09G 3/3696* (2013.01); *G11C 19/28* (2013.01); *G09G 2300/0408* (2013.01); *G09G 2300/0426* (2013.01); *G09G 2310/0267* (2013.01); *G09G 2310/0286* (2013.01); *G09G 2320/0214* (2013.01)

(56) References Cited

U.S. PATENT DOCUMENTS

2006/0164376 A1* 7/2006 Moon .................. G09G 3/3677 345/100
2007/0018918 A1 1/2007 Chung
2007/0132673 A1* 6/2007 Jinno ..................... G09G 3/006 345/76
2007/0296666 A1* 12/2007 Son ...................... G09G 3/3607 345/88
2007/0296681 A1 12/2007 Kim et al.
2008/0068322 A1 3/2008 Lee
2008/0084408 A1 4/2008 Nishimura
2009/0322737 A1* 12/2009 Kim ..................... G09G 3/3677 345/215
2010/0039363 A1 2/2010 Lee et al.
2010/0097368 A1 4/2010 Hwang
2010/0177023 A1 7/2010 Han
2010/0177082 A1 7/2010 Joo et al.
2010/0207928 A1 8/2010 Lee et al.
2010/0214204 A1 8/2010 Fanchiang et al.
2010/0277206 A1* 11/2010 Lee ...................... G09G 3/3677 327/108
2011/0058640 A1 3/2011 Shang et al.
2011/0122117 A1 5/2011 Lee et al.
2011/0148853 A1* 6/2011 Ko ....................... G09G 3/3677 345/213
2011/0298771 A1* 12/2011 Yoo .......................... G09G 3/20 345/211
2012/0280952 A1* 11/2012 Hsu ........................ G09G 3/344 345/204
2013/0113772 A1* 5/2013 Kang ....................... G09G 3/20 345/211
2013/0181747 A1 7/2013 Yoon et al.

FOREIGN PATENT DOCUMENTS

KR 10-2011-0031051 3/2011
KR 10-2013-0083151 7/2013

OTHER PUBLICATIONS

English Abstract for Publication No. 10-2011-0031051.
English Abstract for Publication No. 10-2007-0079489.
European Search Report Dated Feb. 24, 2014.

* cited by examiner

CK
IN1
IN3
VSS1
VSS2
IN2
CRout
OUT
IVTout
513
514
512
511
515
516
Tr15
Tr1
C1
Q
I
Tr2
Tr3
Tr11
Tr7
Tr8
Tr12
Tr13
Tr4
Tr9
Tr9-1
Tr17
Tr10
Tr10-1
Tr11-1

CK
IN1
IN3
VSS1
VSS2
IN2
CRout
OUT
IVTout
513
514
515
516
512
511
Tr15
Tr1
C1
Q
Tr2
Tr3
Tr11
Tr7
Tr8
Tr12
Tr13
I
Tr4
Tr9
Tr9-1
Tr10
Tr10-1
Tr11-1

513
CRout
OUT
IVTout
516
515
Tr15
Tr11
514
Tr1
Tr2
Tr3
C1
Q
515
512
Tr7
I
Tr8
Tr12
Tr13
Tr4
Tr9
Tr9-1
511
Tr17
516
Tr10
Tr10-1
Tr11-1
515
Tr6
516
CK
IN1
IN4
IN3
VSS1
VSS2
IN2

CK
IN1
IN4
IN3
VSS1
VSS2
IN2
CRout
OUT
IVTout
511
512
513
514
515
516
Tr1
Tr2
Tr3
Tr4
Tr6
Tr7
Tr8
Tr9
Tr9-1
Tr10
Tr10-1
Tr11
Tr11-1
Tr12
Tr13
Tr15
Tr17
C1
Q
I

DISPLAY PANEL

CROSS-REFERENCE TO RELATED APPLICATION

This application is a continuation of U.S. application Ser. No. 13/924,221 filed on Jun. 21, 2013, which claims priority to Korean Patent Application No. 10-2012-0108898 filed in the Korean Intellectual Property Office on Sep. 28, 2012, the disclosure of which is incorporated by reference herein in its entirety.

TECHNICAL FIELD

The present invention relates to a display panel.

DISCUSSION OF THE RELATED ART

A flat panel display includes a gate driver and a data driver for driving pixels connected to gate and data lines. The gate driver includes a plurality of stages which may include thin film transistors. When a gate driver supplies a gate signal to a pixel through a gate line, a leakage current may be generated in a thin film transistor included in the gate driver.

SUMMARY

A display device according to an exemplary embodiment of the present invention includes a display area including a gate line and a data line, and a gate driver connected to one end of the gate line, including at least one stage integrated on a substrate and configured to output a gate voltage, wherein the stage includes an inverter unit and an output unit, wherein the output unit includes a first transistor and a first capacitor, wherein the first transistor includes an input terminal applied with a clock signal, a control terminal connected to a node of the inverter unit (e.g., node Q), and an output terminal connected to a gate voltage output terminal through which the gate voltage is output, and wherein an inverter voltage output from the inverter is lower than the gate voltage output by the output unit.

The inverter unit may include at least two transistors connected to the inverter voltage.

The stage may further include a noise removal unit having at least a first transistor pair including a control terminal configured to receive an output voltage of the inverter, an input terminal connected to the node Q, and an output terminal connected to the inverter voltage.

The stage may further include a pull-down unit having at least a second transistor pair including a control terminal configured to receive an output of a next stage, an input terminal connected to the node Q, and an output terminal connected to the inverter voltage.

The noise removal unit may further include at least one transistor including a control terminal configured to receive an output voltage of an inverter of a previous stage, an input terminal connected to the gate voltage output terminal, and an output terminal connected to the gate voltage.

The stage may further include a transmitting signal generator having at least one transistor including an input terminal configured to receive the clock signal, a control terminal connected to the node Q, and an output terminal connected to a transmitting signal output terminal configured to output a transmitting signal.

The pull-down unit may further include at least one transistor including a control terminal configured to receive an output of a next stage, an input terminal connected to the transmitting signal output terminal, and an output terminal connected to the inverter voltage.

The pull-down unit may further include at least one transistor configured to receive an output of a second next stage and including an input terminal connected to the node and an output terminal connected to the inverter voltage.

At least one of the transistors may include an oxide semiconductor.

The stage may further include a pull-down unit including at least a transistor pair having a control terminal configured to receive an output of a next stage, an input terminal connected to the node, and an output terminal connected to the gate voltage.

The stage may further include a pull-down unit including at least one transistor including a control terminal configured to receive an output of a next stage, an input terminal connected to the node, and an output terminal connected to the inverter voltage.

The stage may further include a pull-down unit including at least one transistor having a control terminal configured to receive an output of a next stage, an input terminal connected to the node, and an output terminal connected to the gate voltage.

The stage may further include a noise removal unit including at least one transistor including a control terminal configured to receive an output voltage of the inverter, an input terminal connected to the node, and an output terminal connected to the inverter voltage.

A display device according to an exemplary embodiment of the present invention includes a display area including a gate line and a data line, and a gate driver connected to an end of the gate line, the gate driver including at least one stage integrated on a substrate and configured to output a gate voltage, wherein the stage includes an inverter unit and an output unit, wherein the output unit includes a first transistor and a first capacitor, wherein the first transistor includes an input terminal applied with a clock signal, a control terminal connected to a node of the inverter (e.g., node Q), and an output terminal connected to a gate voltage output terminal through which the gate voltage is output, and wherein a low voltage output from the inverter is the gate voltage output by the output unit. The inverter unit may include at least two transistors including output terminals connected to an inverter voltage that is lower than the gate voltage.

DETAILED DESCRIPTION OF THE EXEMPLARY EMBODIMENTS

Figure 1:
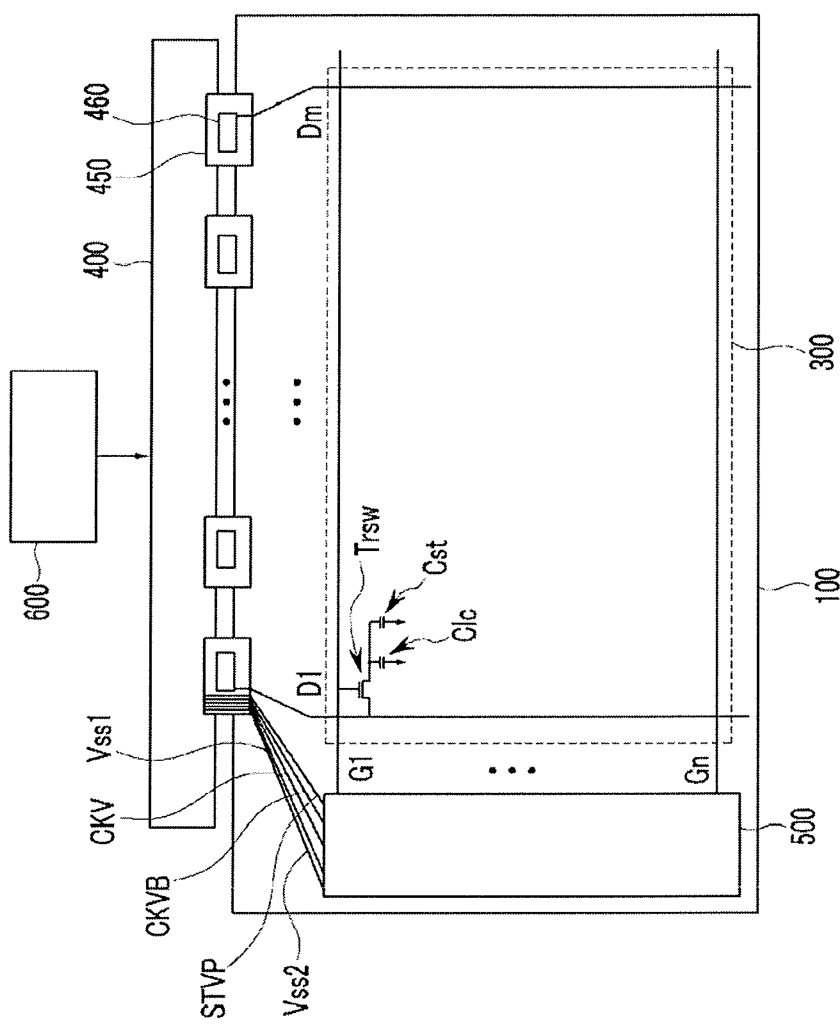
FIG. 1 is a top plan view illustrating a display panel according to an exemplary embodiment of the present invention.

Hereinafter, embodiments of the present invention will be described in detail with reference to the accompanying drawings. The present invention may, however, be embodied in many different forms and should not be construed as being limited to the embodiments set forth herein.

Like reference numerals may designate like or similar elements throughout the specification and drawings. It will be understood that when an element is referred to as being "on," "connected to" or "coupled to" another element, it can be directly on, connected to or coupled to the other element or intervening elements may be present.

As used herein, the singular forms "a," "an" and "the" are intended to include the plural forms as well, unless the context clearly indicates otherwise.

FIG. 1 is a top plan view illustrating a display device according to an exemplary embodiment of the present invention.

Referring to FIG. 1, a display panel 100 according to an exemplary embodiment of the present invention includes a display area 300 for displaying images and a gate driver 500 for applying a gate voltage to a gate line of the display area 300. A data line of the display area 300 is applied with a data voltage from a data driver IC 460 formed on a film, such as a flexible printed circuit (FPC) film 450, attached to the display panel 100. The gate driver 500 and the data driver IC 460 are controlled by a signal controller 600. A printed circuit board (PCB) 400 is formed outside the film such as the flexible printed circuit film 450 and transmits signals from the signal controller 600 to the data driver IC 460 and the gate driver 500. The signals provided from the signal controller 600 may include, e.g., a first clock signal CKV, a second clock signal CKVB, a scan start signal STVP, and low voltages Vss1 and Vss2. Each of the low voltages Vss1 and Vss2 has a predetermined level. According to an exemplary embodiment of the present invention, only one of the low voltages may be provided.

When the display panel 100 is a liquid crystal panel, the display area 300 includes a thin film transistor Trsw, a liquid crystal capacitor CIc, and a storage capacitor Cst, and FIG. 1 shows an example of the liquid crystal panel. When the display panel 100 is an organic light emitting display (OLED) panel, the display area 300 includes a thin film transistor and an organic light emitting diode. The present invention is not limited to the liquid crystal panel, but for purposes of description, a liquid crystal panel will be described as an example.

The display area 300 includes a plurality of gate lines G1-Gn and a plurality of data lines D1-Dm insulated from the gate lines G1-Gn and intersecting the gate lines G1-Gn.

Each pixel PX includes a thin film transistor Trsw, a liquid crystal capacitor CIc, and a storage capacitor Cst. A control terminal of the thin film transistor Trsw is connected to a gate line, an input terminal of the thin film transistor Trsw is connected to a data line, and an output terminal of the thin film transistor Trsw is connected to a terminal of the liquid crystal capacitor CIc and a terminal of the storage capacitor Cst. The other terminal of the liquid crystal capacitor CIc is connected to a common electrode, and the other terminal of the storage capacitor Cst is applied with a storage voltage Vcst from the signal controller 600. According to an embodiment of the present invention, the pixel PX of the liquid crystal panel may include an additional constitutional element.

The plurality of data lines D1-Dm receive data voltages from the data driver IC 460, and the plurality of gate lines G1-Gn receive gate voltages from the gate driver 500.

The data driver IC 460 is formed at an upper or lower side of the display panel 100 and is connected to the data lines D1-Dm extending in a vertical direction. As shown in FIG. 1, the data driver IC 460 is positioned, for example, at the upper side of the display panel 100.

The gate driver 500 receives clock signals CKV and CKVB, a scan start signal STVP, a first low voltage Vss1 corresponding to a gate-off voltage, and a second low voltage Vss2 that is lower than the gate-off voltage and generates gate voltages (a gate-on voltage and a gate-off voltage). The gate driver 500 sequentially applies the gate-on voltage to the gate lines G1-Gn.

The clock signals CKV and CKVB, the scan start signal STVP, the first low voltage Vss1, and the second low voltage Vss2 are applied to the gate driver 500 through a flexible printed circuit film 450 positioned closest to the gate driver 500 among flexible printed circuit films 450 which includes data driver ICs 460, respectively. The signals CKV, CKVB, STVP, Vss1, and Vss2 are transmitted to the flexible printed circuit film 450 through the printed circuit board (PCB) 400 from the outside or from the signal controller 600.

Figure 2:
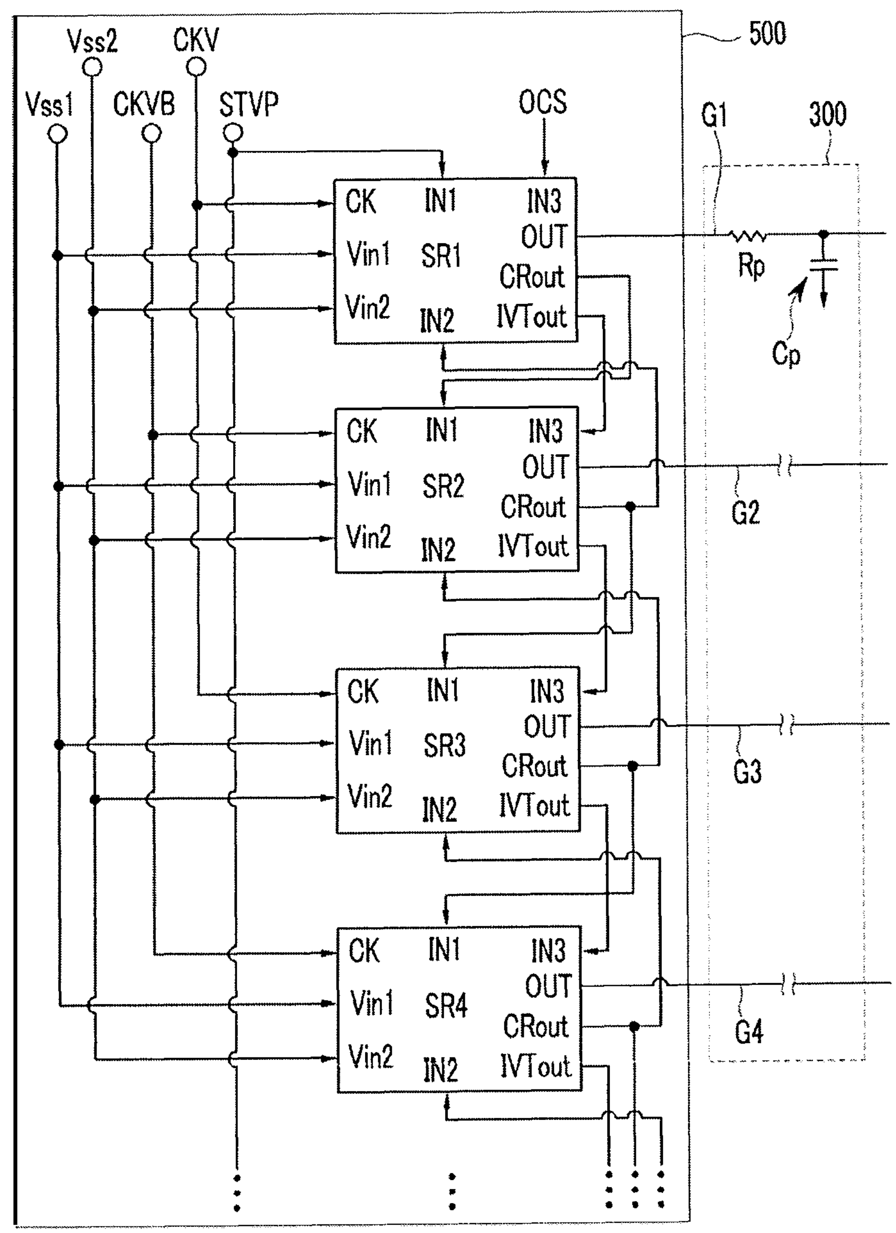
FIG. 2 is a block diagram illustrating a gate driver and a gate line of FIG. 1.

FIG. 2 is a block diagram illustrating the gate driver and gate lines of FIG. 1.

As shown in FIG. 2, the display area 300 includes a plurality of resistors Rp and a plurality of capacitors Cp. The gate lines G1-Gn have their respective resistances Rp, and are connected to their respective liquid crystal capacitor Clc and storage capacitor Cst. A sum of the capacitances Clc and Cst is represented as an equivalent capacitance Cp. As shown in FIG. 2, each gate line may be represented as connected to a resistor Rp and a capacitor Cp in a circuit diagram. The values of the resistor Rp and capacitor Cp may be changed according to the structure and the characteristics of the display area 300. A gate voltage output from a stage SR (e.g., SR1, SR2, . . . ) is transmitted to its corresponding gate line.

The gate driver 500 includes a plurality of stages SR1, SR2, SR3, SR4, . . . that are dependently connected to each other. Each of the stages SR1, SR2, SR3, SR4, . . . includes four input terminals IN1, IN2, and IN3, one clock input terminal CK, two voltage input terminals Vin1 and Vin2, a gate voltage output terminal OUT outputting the gate voltage, a transmission signal output terminal CRout, and an inverter signal output terminal IVTout.

The first input terminal IN1 is connected to the transmission signal output terminal CRout of a previous stage and receives a transmission signal CR of the previous stage. The first stage does not have a previous stage and a scan start signal STVP is applied to the first input terminal IN1.

The second input terminal IN2 is connected to the transmission signal output terminal CRout of a next stage and receives a transmission signal CR of the next stage.

A stage SR(n−1) connected to the (n−1)-th gate line Gn−1 and a stage SRn connected to the n-th gate line Gn may have two next dummy stages SR(n+1) and SR(n+2) to receive transmission signals CR. The dummy stages SR(n+1) and SR(n+2) generate and output a dummy gate voltage differently from the different stages SR1-SRn. Gate voltages output from the stages SR1-SRn are transmitted through their respective gate lines to their respective pixels such that data voltages may be applied to their respective pixels for the display of images. However, the dummy stages SR(n+1) and SR(n+2) are not connected to the gate lines, or are connected to gate lines of dummy pixels that do not display images.

The third input terminal IN3 is connected to an inverter signal output terminal IVTout of a previous stage and receives an inverter signal IVT of the previous stage. The first stage does not have a previous stage and a separate signal corresponding to the first stage may be generated and input to the third input terminal IN3 of the first stage, or a dummy stage SR(n+1) or SR(n+2) may generate a signal having an appropriate timing and transmit the signal to the third input terminal IN3 of the first stage. For example, during a section 1 H when a gate-on voltage is applied from a corresponding stage, a signal having a timing when a low voltage Vss1 or Vss2 is applied is referred to as an output control signal OCS.

The clock terminals CK are applied with a clock signal, and among the plurality of stages, the clock terminals CK of odd-numbered stages are applied with a first clock signal CKV, and the clock terminals CK of even-numbered stages are applied with a second clock signal CKVB. The first clock signal CKV and the second clock signal CKVB have opposite phases, respectively.

The first voltage input terminal Vin1 is applied with the first low voltage Vss1 corresponding to a gate-off voltage, and the second voltage input terminal Vin2 is applied with the second low voltage Vss2 that is lower than the first low voltage Vss1. The first low voltage Vss1 and the second low voltage Vss2 may have various values according to exemplary embodiments of the present invention. For example, according to an exemplary embodiment of the present invention, the first low voltage Vss1 is −6 V and the second low voltage Vss2 is −10 V. The second low voltage Vss2 is lower than the first low voltage Vss1.

The operation of the gate driver 500 is now described.

The first stage SR1 receives the first clock signal CKV provided from the outside through the clock input terminal CK, the scan start signal STVP through the first input terminal IN1, the first and second low voltages Vss1 and Vss2 through the first and second voltage input terminals Vin1 and Vin2, the transmission signals CR respectively provided from the second stage SR2 through the second input terminal IN2, and the output control signal through the third input terminal IN3, and outputs the gate-on voltage to the first gate line through the gate voltage output terminal OUT. The transmission signal output terminal CRout outputs the transmission signal CR and transmits the transmission signal CR to the first input terminal IN1 of the second stage SR2, and the inverter signal output terminal IVTout transmits the inverter signal IVT to the third input terminal IN3 of the second stage SR2.

The second stage SR2 receives the second clock signal CKVB provided from the outside through the clock input terminal CK, the transmission signal CR of the first stage SR1 through the first input terminal IN1, the first and second low voltages Vss1 and Vss2 through the first and second voltage input terminals Vin1 and Vin2, the transmission signals CR provided from the third stage SR3 through the second input terminal IN2, and the inverter signal IVT provided from the first stage SR1 through the third input terminal IN3, and outputs the gate-on voltage to the second gate line through the gate voltage output terminal OUT. The transmission signal CR is output through the transmission signal output terminal CRout and transmitted to the first input terminal IN1 of the third stage SR3 and the second input terminal IN2 of the first stage SR1. The inverter signal IVT is transmitted to the third input terminal IN3 of the third stage SR3 from the inverter signal output terminal IVTout.

The third stage SR3 receives the first clock signal CKV provided from the outside through the clock input terminal CK, the transmission signal CR of the second stage SR2 through the first input terminal IN1, the first and second low voltages Vss1 and Vss2 through the first and second voltage input terminals Vin1 and Vin2, the transmission signals CR provided from the fourth stage SR4 through the second input terminals IN2, and the inverter signal IVT provided from the second stage SR2 through the third input terminal IN3, and outputs the gate-on voltage to the third gate line through the gate voltage output terminal OUT. The transmission signal CR is output through the transmission signal output terminal CRout and transmitted to the first input terminal IN1 of the fourth stage SR4 and the second input terminal IN2 of the second stage SR2. The inverter signal IVT is transmitted to the third input terminal IN3 of the fourth stage SR4 from the inverter signal output terminal IVTout.

The n-th stage SRn receives the second clock signal CKVB provided from the outside through the clock input terminal CK, the transmission signal CR of the (n−1)-th stage SR2 through the first input terminal IN1, the first and second low voltages Vss1 and Vss2 through the first and second voltage input terminals Vin1 and Vin2, the transmission signals CR respectively provided from the (n+1)-th stage SR(n+1) (the dummy stage) through the second input terminal IN2, and the inverter signal IVT provided from the (n−1)-th stage SRn−1 through the third input terminal IN3, and outputs the gate-on voltage to the n-th gate line through the gate voltage output terminal OUT. The transmission signal CR is output through the transmission signal output terminal CRout and transmitted to the first input terminal IN1 of the (n+1)-th stage SR(n+1) (the dummy stage) and the second input terminal IN2 of the (n−1)-th stage SR(n−1). The inverter signal IVT is transmitted to the (n+1)-th stage SRn+1 (the dummy stage) from the inverter signal output terminal IVTout.

Figure 3:
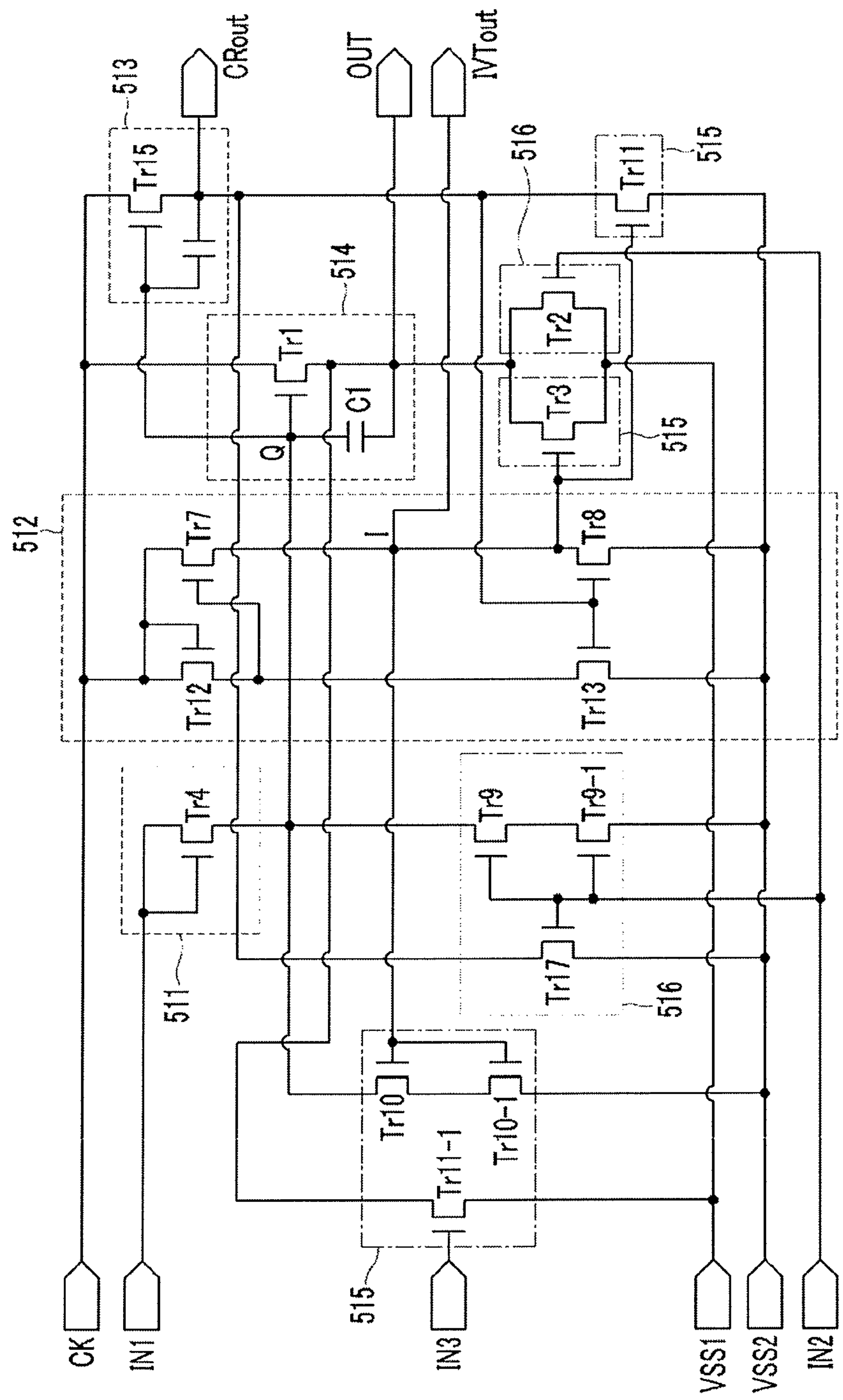
FIG. 3 is an enlarged circuit diagram illustrating a stage of a gate driver according to an exemplary embodiment of the present invention.

FIG. 3 is an enlarged circuit diagram illustrating a stage of a gate driver according to an exemplary embodiment of the present invention.

Referring to FIG. 3, a stage SR of the gate driver 500 according to an exemplary embodiment of the present invention includes an input unit 511, an inverter unit 512, a transmission signal generator 513, an output unit 514, a noise removal unit 515, and a pull-down unit 516.

The input unit 511 includes one transistor (a fourth transistor Tr4). The input terminal and the control terminal of the fourth transistor Tr4 are commonly connected (e.g., referred to as "diode-connected") to the first input terminal IN1, and the output terminal of the fourth transistor Tr4 is connected to a node Q (hereinafter referred to as a first node). The input unit 511 transmits a high voltage to the node Q when the first input terminal IN1 is applied with the high voltage.

The inverter unit 512 includes four transistors (a twelfth transistor Tr12, a seventh transistor Tr7, an eighth transistor Tr8, and a thirteenth transistor Tr13). An input terminal of the twelfth transistor Tr12 is diode-connected to a control terminal and connected to the clock input terminal CK, and an output terminal of the twelfth transistor Tr12 is connected to the control terminal of the seventh transistor Tr7 and the input terminal of the thirteenth transistor Tr13. The seventh transistor Tr7 includes the control terminal connected to the output terminal of the twelfth transistor Tr12, the input terminal connected to the clock input terminal CK, and the output terminal connected to a node I (referred to as an inverter node or a second node). The eighth transistor Tr8 includes the control terminal connected to the transmitting signal output terminal CRout of the current stage, the input terminal connected to the node I, and the output terminal connected to the second voltage input terminal Vin2. The thirteenth transistor Tr13 includes the input terminal connected to the output terminal of the twelfth transistor Tr12, the control terminal connected to the transmitting signal output terminal CRout of the current stage, and the output terminal connected to the second voltage input terminal Vin2. When a high signal is applied to the stage as a clock signal, the clock signal is transmitted to the input terminals of the eighth and thirteenth transistors Tr8 and Tr13 by way of the twelfth and seventh transistors Tr12 and Tr7, and the node I has a high voltage. The transmitted high signal decreases the voltage of the node I to the second low voltage VSS2 when the transmitting signal CR is output from the transmitting signal output terminal CRout of the current stage. Thus, the node I of the inverter unit 512 has an opposite voltage level to voltage levels of the transmitting signal CR of the current stage and the gate-on voltage.

The transmission signal generator 513 includes one transistor (a fifteenth transistor Tr15). The input terminal of the fifteenth transistor Tr15 is connected to the clock terminal CK and receives the first clock signal CKV or the second clock signal CKVB, the control terminal of the fifteenth transistor Tr15 is connected to the output terminal of the input section 511, e.g., the node Q, and the output terminal of the fifteenth transistor Tr15 is connected to the transmission signal output terminal CRout that outputs the transmission signal CR. A parasitic capacitance may be generated between the control terminal and the output terminal of the fifteenth transistor Tr15. The output terminal of the fifteenth transistor Tr15 is connected to a noise removal unit 515, a pull-down unit 516, and the transmitting signal output terminal CRout, and receives the second low voltage Vss2. Thus, when the transmission signal CR is low, the voltage value of the transmission signal CR is the second low voltage Vss2.

The output unit 514 includes one transistor (a first transistor Tr1) and one capacitor (a first capacitor C1). The control terminal of the first transistor Tr1 is connected to the node Q, and the input terminal of the first transistor Tr1 receives the first clock signal CKV or the second clock signal CKVB through the clock terminal CK. The first capacitor C1 is formed between the control terminal and the output terminal of the first transistor Tr1. The output terminal of the first transistor Tr1 is connected to the gate voltage output terminal OUT. The output terminal of the first transistor Tr1 is connected to the noise removal unit 515 and the pull-down unit 516, and is thus connected to the first voltage input terminal Vin1 through the noise removal unit 515 and the pull-down unit 516. Thus, the gate-off voltage is the first low voltage Vss1. The output unit 514 outputs a gate voltage according to a voltage of the node Q and the first clock signal CKV. A voltage difference is generated between the control terminal and the output terminal of the first transistor Tr1 by the voltage of the node Q, and when the this voltage difference is charged in the first capacitor C1 and then a high voltage is applied by the clock signal, the high voltage is output as a gate-on voltage when the charged voltage is boosted.

The noise removal unit 515 is controlled by an output of the node I and includes five transistors (a third transistor Tr3, tenth and tenth-1 transistors Tr10 and Tr10-1, an eleventh transistor Tr11, and an eleventh-1 transistor Tr11-1). The third transistor Tr3 includes the control terminal connected to the node I, the input terminal connected to the gate voltage output terminal OUT, and the output terminal connected to the first voltage input terminal Vin1. The third transistor Tr3 changes a voltage of the gate voltage output terminal OUT to the first low voltage Vss1 according to a voltage of the node I. The tenth and tenth-1 transistors Tr10 and Tr10-1 constitute a transistor pair. An output terminal of the tenth transistor Tr10 is connected to an input terminal of the tenth-1 transistor Tr10-1. The control terminals of the tenth and tenth-1 transistors Tr10 and Tr10-1 are connected to the same terminal (hereinafter, simply referred to as an "additional connected") and are connected to the node I. The input terminal of the transistor pair is connected to the node Q, and the output terminal of the transistor pair is connected to the second voltage input terminal Vin2. The tenth and tenth-1 transistors Tr10 and Tr10-1 change a voltage of the node Q to the second low voltage Vss2 according to a voltage of the node I. A pair of additional connected transistors divide a voltage difference between the second low voltage and the node I such that a leakage current of the node Q may be decreased. According to an exemplary embodiment of the present invention, the tenth and tenth-1 transistors Tr10 and Tr10-1 may have at least one more thin film transistor additional connected to the transistors Tr10 and Tr10-1. In this case, the input terminal or the output terminal of the additional transistor may be connected to the input or output terminal of the transistor pair, and the control terminal of the additional transistor may be connected to the same node I. The eleventh transistor Tr11 includes the control terminal connected to the node I, the input terminal connected to the transmitting signal output terminal CRout, and the output terminal connected to the second voltage input terminal Vin2. The eleventh transistor Tr11 changes a voltage of the transmitting signal output terminal CRout to the second low voltage Vss2 according to a voltage of the node I. The eleventh-1 transistor Tr11-1 includes the control terminal connected to the node I of a previous stage through the third input terminal IN3, the input terminal connected to the gate voltage output terminal OUT, and the output terminal connected to the first voltage input terminal Vin1. The eleventh-1 transistor Tr11-1 changes a voltage of the gate voltage output terminal OUT to the first low voltage Vss1 according to a voltage of the node I (the inverter output) of a previous stage. The third transistor Tr3 changes the gate voltage output terminal OUT to the first low voltage Vss1 by an inverter output of the current stage, and the eleventh-1 transistor Tr11-1 changes the gate voltage output terminal OUT to the first low voltage Vss1 by an inverter output of a previous stage.

The pull-down unit 516 is controlled by the transmitting signal CR of a next stage. The pull-down unit 516 includes four transistors (a second transistor Tr2, a ninth transistor Tr9, a ninth-1 transistor Tr9-1, and a seventeenth transistor Tr17). The second transistor Tr2 includes the control terminal connected to the second input terminal IN2, the input terminal connected to the gate voltage output terminal OUT, and the output terminal connected to the first voltage input terminal Vin1. The second transistor Tr2 changes a voltage of the gate voltage output terminal OUT to the first low voltage Vss1 according to the transmitting signal CR of a next stage. The ninth and ninth-1 transistors Tr9 and Tr9-1 constitute a transistor pair. An input terminal of the ninth-1 transistor Tr9-1 and an output terminal of the ninth transistor Tr9 are connected to each other. The control terminals of the ninth and ninth-1 transistors Tr9 and Tr9-1 are connected to the same terminal. In other words, the ninth and ninth-1 transistors Tr9 and Tr9-1 are additional connected to each other. The control terminals of the ninth and ninth-1 transistors Tr9 and Tr9-1 are connected to the second input terminal IN2. An input terminal of the transistor pair is connected to the node Q, and an output terminal of the transistor pair is connected to the second voltage input terminal Vin2. A pair of additional connected transistors divide a voltage difference (e.g., a low voltage difference) between the second low voltage and the carry signal of a next stage to be applied such that a leakage current of the node Q may be decreased. According to an exemplary embodiment of the present invention, the ninth and ninth-1 transistor Tr9 and Tr9-1 may have at least one more thin film transistors additional connected to the ninth and ninth-1 transistors Tr9 and Tr9-1. In this case, the input terminal or the output terminal of the additional transistor may be connected to the input or output terminal of the transistor pair, and the control terminal of the additional transistor may be connected to the same second input terminal IN2. The seventeenth transistor Tr17 includes the control terminal connected to the second input terminal IN2, the input terminal connected to the transmitting signal output terminal CRout, and the output terminal connected to the second voltage input terminal Vin2.

The gate voltage and transmitting signal CR has various voltage values. In an exemplary embodiment of the present invention, the gate-on voltage is 25 V, the gate-off voltage and the first low voltage Vss1 are −5 V, the high voltage of the transmitting signal CR is 25 V, and the low voltage and the second low voltage Vss2 are −10 V.

In summary, the transmission signal generator 513 and the output unit 514 are operated by a voltage of the node Q such that one stage SR outputs a high voltage of the transmission signal CR and a gate-on voltage, the transmission signal CR is decreased from the high voltage to the second low voltage Vss2 by the transmission signals CR of a previous and next stages, and the gate-on voltage is decreased to the first low voltage Vss1 that then becomes a gate-off voltage.

The output terminals of the eighth transistor Tr8 and the thirteenth transistor Tr13 of the inverter unit 512 are connected to the second low voltage Vss2. Thus, the second low voltage Vss2 is provided as a low voltage of the node I. This affects a transistor of the noise removal unit 515 having the control terminal that receives a voltage of the node I as an output of the inverter. For example, for the tenth and tenth-1 transistors Tr10 and Tr10-1, a voltage level difference between a low voltage (the second low voltage Vss2) among voltages (the voltage of the node I) of the control terminal and a voltage (the second low voltage Vss2) of the output terminal is not generated such that the voltage difference between the source electrode and the gate electrode of the thin film transistor becomes 0, and thus, no leakage current is generated. This effect may be maintained even when an oxide semiconductor is used as the channel layer of the thin film transistor. In general, a thin film transistor using an oxide semiconductor generates ten times more leakage current than with a leakage current generated from a thin film transistor using amorphous silicon. The characteristics of the thin film transistor using the oxide semiconductor are shown in FIG. 4.

Figure 4:
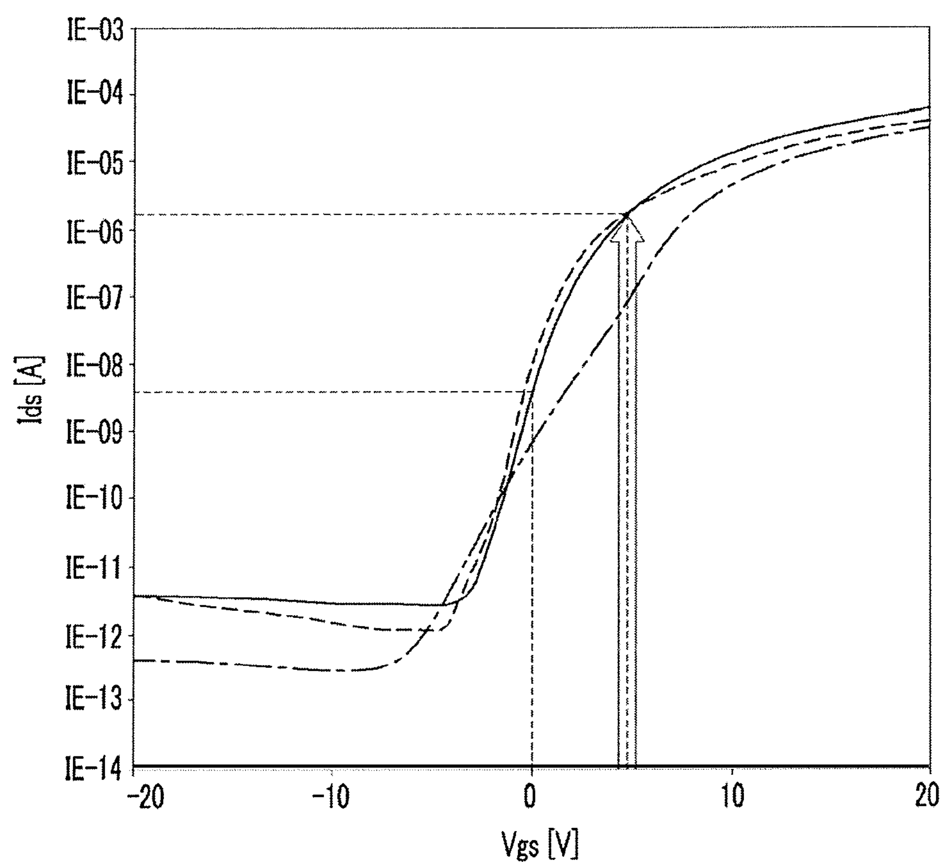
FIG. 4 is a graph illustrating a current versus a voltage of a thin film transistor including an oxide semiconductor.

FIG. 4 is a graph illustrating a current versus a voltage of a thin film transistor including an oxide semiconductor, in which the horizontal axis represents a voltage difference between a gate electrode and a source electrode, and the vertical axis represents a current (a leakage current) between the source electrode and the drain electrode.

As shown in FIG. 4, the thin film transistor using the oxide semiconductor is sensitive to a change in the voltage, and the leakage current is suddenly decreased, and reducing the voltage difference between the gate electrode and the source electrode may reduce the leakage current.

Different from the eighth transistor Tr8 and the thirteenth transistor Tr13 of FIG. 3, when the output terminal is connected to the first low voltage Vss1, the low voltage of the node I is −5 V, and in this case, the tenth and tenth-1 transistors Tr10 and Tr10-1 are applied with the second low voltage Vss2 of −10 V and the control terminal is applied with the low voltage of −5 V, and thus, the voltage difference of 5 V is generated. Referring to FIG. 4, a relatively high leakage current is generated which is increased by about $10^4$ times. As shown in FIG. 3, the output terminals of the eighth transistor Tr8 and the thirteenth transistor Tr13 are connected to the second low voltage Vss2, and thus, the leakage current of the transistor included in the noise removal unit 515 may be reduced and a decrease in the gate-on voltage due to the current of the node Q may be prevented.

To reduce the current leakage of the node Q, as shown in FIG. 3, a pair of thin film transistors have a additional connected structure, in which the input terminal of one of the thin film transistors is connected to the output terminal of the other thin film transistor, and the control terminals of the thin film transistors are connected to the same terminal. For example, the ninth and ninth-1 transistors and the tenth and tenth-1 transistors shown in FIG. 3 have the additional connected structure. Two pairs of transistors decrease a voltage of the node Q to the second low voltage Vss2. The ninth and ninth-1 transistors Tr9 and Tr9-1 are operated according to the transmitting signal CR of a next stage, and the tenth and tenth-1 transistors Tr10 and Tr10-1 are operated by an inverter output (a voltage of the node I). The pairs of transistors having the additional connected structure may further decrease the leakage current compared with when the transistors are formed individually. For example, a leakage current may be generated even when a transistor is in the turn-off state due to a voltage difference between a voltage applied to the control terminal of the transistor and the second low voltage. When two transistors are additional connected to each other, the two transistors share the voltage difference, and thus, the leakage current may be decreased through these transistors. For example, in a thin film transistor using an oxide semiconductor, as shown in FIG. 4, the leakage current is exponentially increased according to an increase in the voltage, however when the voltage is decreased by half, the leakage current may be decreased by more than half.

Also, in the exemplary embodiment of FIG. 3, by using the voltage (the inverter output) of the node I of the previous stage by the eleventh-1 transistor Tr11-1, the period that is floated is maintained to not be floated in the present stage, and thereby the gate voltage is stabilized. Accordingly, the gate voltage may be maintained as the low voltage for noise that is generated while the clock signal is inverted.

Also, in the exemplary embodiment of FIG. 3, by using the seventeenth transistor Tr17, a noise (glitch noise) generated in the output terminal of the transmitting signal CR by the delay of the clock signal is removed based on the transmitting signal CR of the next stage.

Also, in the exemplary embodiment of FIG. 3, a transistor and wiring lines for stabilizing the current stage by using the signal, for example, the transmitting signal CR, of the second next stage is omitted. According to an exemplary embodiment, the node Q of the current stage or the voltage of the node I may be stabilized by this transistor, however in the exemplary embodiment of FIG. 3, the transistor and wiring lines are omitted to simplify the wiring connection between the stages, and one transistor may be omitted from the stage thereby reducing the size thereof. Thus, the size of the gate driver included in the peripheral area around the display area for displaying the image in the display device may be reduced to thus obtain a reduced bezel.

In the exemplary embodiment of FIG. 3, the output terminals of the ninth and ninth-1 transistors are connected to the second low voltage Vss2, and thus, a delay of a time during which the gate voltage is decreased by a delay generated at the node Q may be reduced. The voltage of the node Q is decreased to the low voltage, and thus, the gate voltage is quickly decreased to the low voltage. Thus, the size of the transistor, e.g., the second transistor Tr2, for pulling down the voltage of the gate voltage output terminal OUT may be reduced. By reducing the size of the transistor included in the stage, the size of each stage is decreased, and thus, the bezel of a display device may be reduced.

Figure 5:
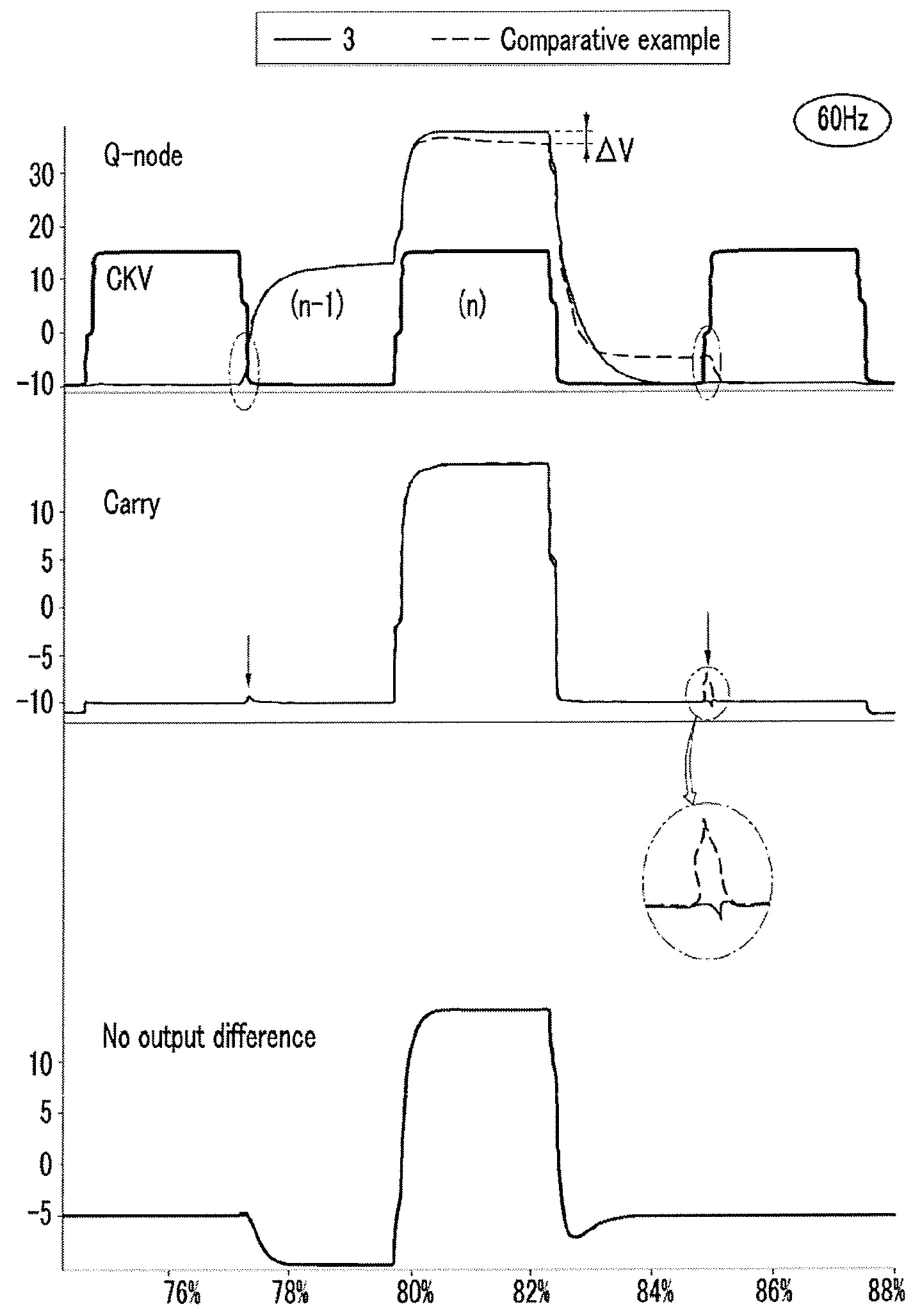
FIG. 5 to FIG. 7 are timing diagrams showing operation characteristics of a gate driver according to an exemplary embodiment of the present invention.
Figure 6:
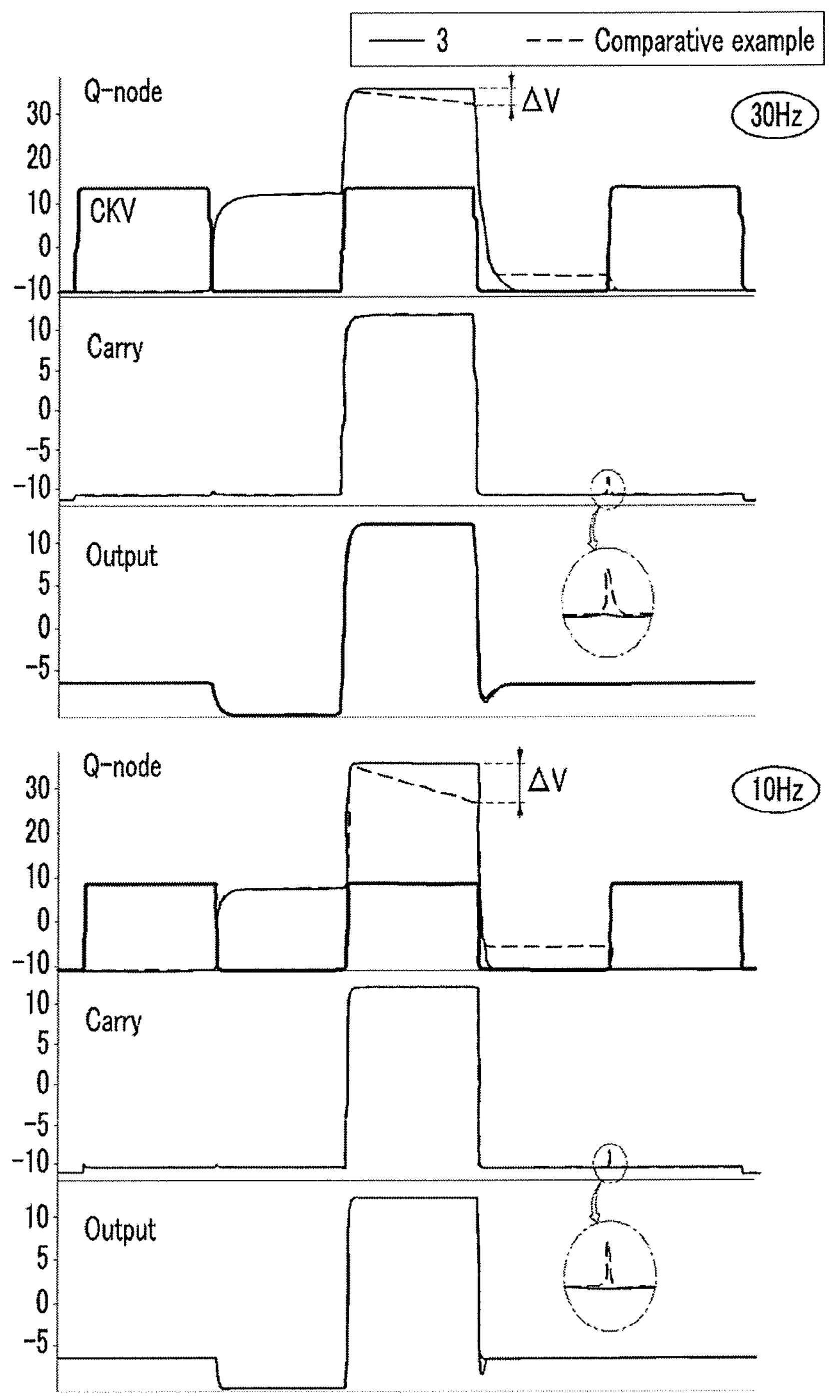
Figure 7:
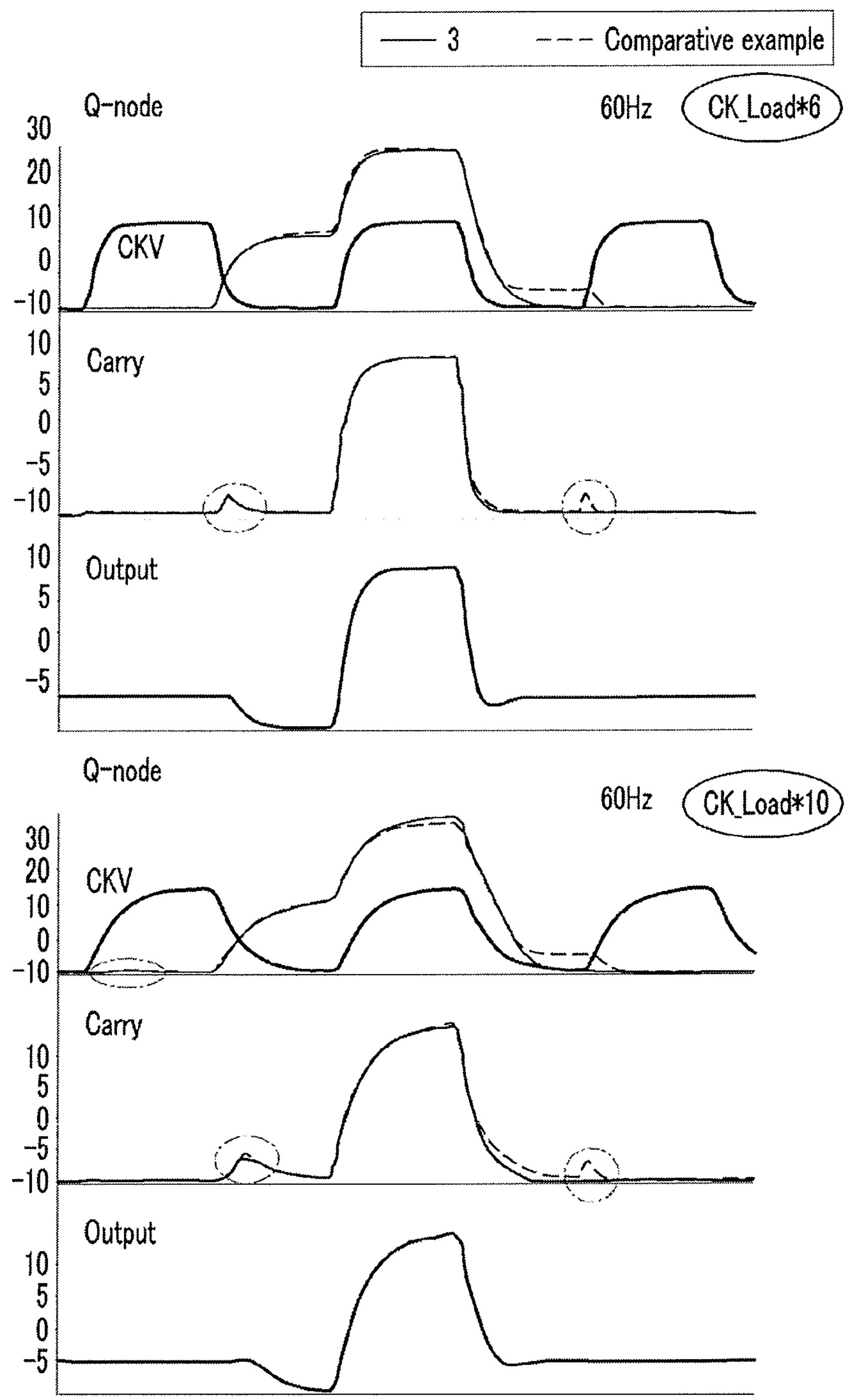

FIG. 5 to FIG. 7 are timing diagrams illustrating operation characteristics of a gate driver according to an exemplary embodiment of the present invention.

In FIG. 5 to FIG. 7, solid lines represent the exemplary embodiment described above in connection with FIG. 3, and dotted lines represent a comparative example. An experiment was performed based on a thin film transistor using an oxide semiconductor.

According to the first graph of FIG. 5, the comparative example and the exemplary embodiment of FIG. 3 show the same boosted voltage. However, in the exemplary embodiment of FIG. 3, the current leakage is small and the voltage is maintained, but in the comparative example, the voltage is decreased by the current leakage at the node Q.

Further, in the exemplary embodiment of FIG. 3, the gate-on voltage is decreased to the gate-off voltage with no or little delay, but in the comparative example, a voltage of a predetermined level is maintained during a period of about 1 H since the voltage is quickly decreased at the node Q.

In the second graph of FIG. 5, an output of the transmitting signal CR has noise as shown in the enlarged view. The noise is also referred to as glitch noise and is generated by a clock signal in the comparative example. However, in the exemplary embodiment of FIG. 3, no noise is generated.

FIG. 5 shows gate-on voltages generated in the comparative example and in the exemplary embodiment of FIG. 3. The gate-on voltages are substantially identical to each other. In the comparative example, an appropriate gate-on voltage is generated, and the voltage of the node Q and the transmitting signal CR may be abnormally operated in a long time.

FIG. 5 shows the experimental results obtained in the exemplary embodiment of FIG. 3 and in the comparative example when the driving operation is performed at 60 Hz. FIG. 6 shows resultant values obtained when the driving operation is performed at relatively low frequencies, such as 30 Hz and 10 Hz. In the low frequency driving, the comparative example more clearly exhibits occurrence of glitch noise. However, in the exemplary embodiment of FIG. 3, the results of the driving operation are substantially the same as the results obtained when the driving operation is performed at 60 Hz as shown in FIG. 5. Thus, although the driving frequency is decreased to reduce power consumption when a still image is displayed, the exemplary embodiment of FIG. 3 does not cause a deterioration of the display quality due to an output of the gate driver.

FIG. 7 shows resulting waveforms with glitch noise, which are obtained when a larger load is applied to the clock signal CKV.

Referring to an upper portion of FIG. 7, in which a load which is about six times larger than a general load is applied, as shown in the second graph of FIG. 7, a large noise (glitch noise) is generated in the exemplary embodiment of FIG. 3 and the comparative example compared with the examples described above in connection with FIG. 5 and FIG. 6, but no delay occurs at the node Q or the gate output in the exemplary embodiment of FIG. 3. However, in the comparative example, a delay is generated when the voltage of the node Q is decreased to the low voltage.

When a load that is about ten times larger than a general load is applied as shown in a lower portion of FIG. 7, a large noise (glitch noise) is generated in the exemplary embodiment of FIG. 3 and in the comparative example, but no delay occurs at the node Q or the gate output in the exemplary embodiment of FIG. 3. However, a delay is generated when the voltage of the node Q is decreased to the low voltage in the comparative example.

As described above, in the exemplary embodiment of FIG. 3, good characteristics are obtained for the gate voltage, the voltage of the node Q, and the transmitting signal.

FIG. 8 to FIG. 12 show enlarged circuit diagrams of a stage in a gate driver according to exemplary embodiments of the present invention.

Figure 8:
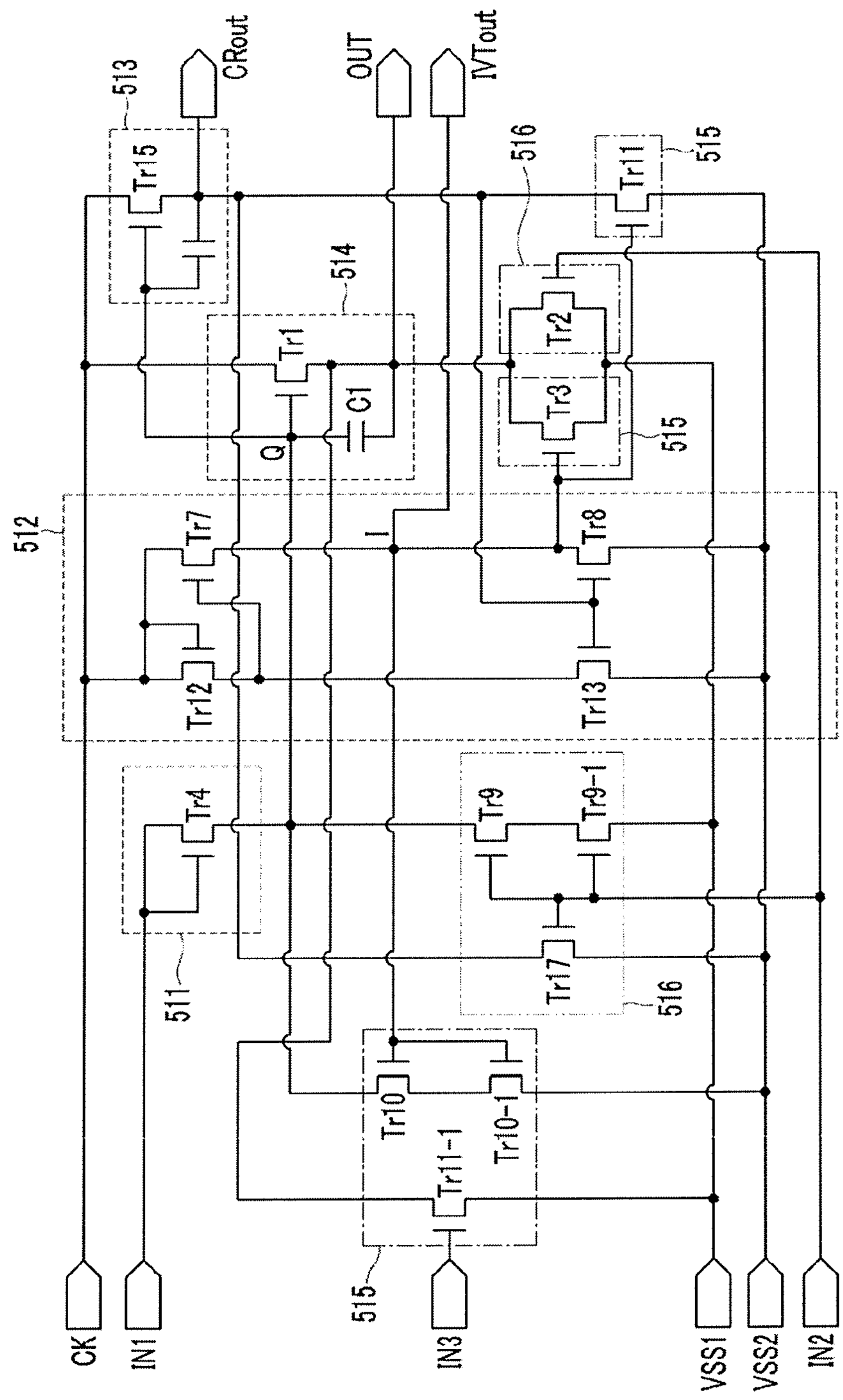
FIG. 8 to FIG. 12 are enlarged circuit diagrams of a stage in a gate driver according to exemplary embodiments of the present invention.

In FIG. 8, the output terminal of the ninth-1 transistor Tr9-1 is connected to the first voltage input terminal Vin1.

Thus, a pair of transistors Tr9 and Tr9-1 that are additional connected to each other allows a voltage of the node Q of the current stage to be decreased to the first low voltage Vss1 by the transmitting signal CR of a next stage.

According to the exemplary embodiment of FIG. 8, the voltage of the node Q is prevented from being decreased to the second low voltage Vss2 by the ninth and ninth-1 transistors Tr9 and Tr9-1, and thus, a delay may be generated when the voltage of the node Q is decreased to the low voltage, but transistors of the pull-down unit 516 may prevent any malfunction from occurring due to such delay. As shown in FIG. 5 to FIG. 7, the output of the gate-on voltage is not changed in the comparative example.

Figure 9:
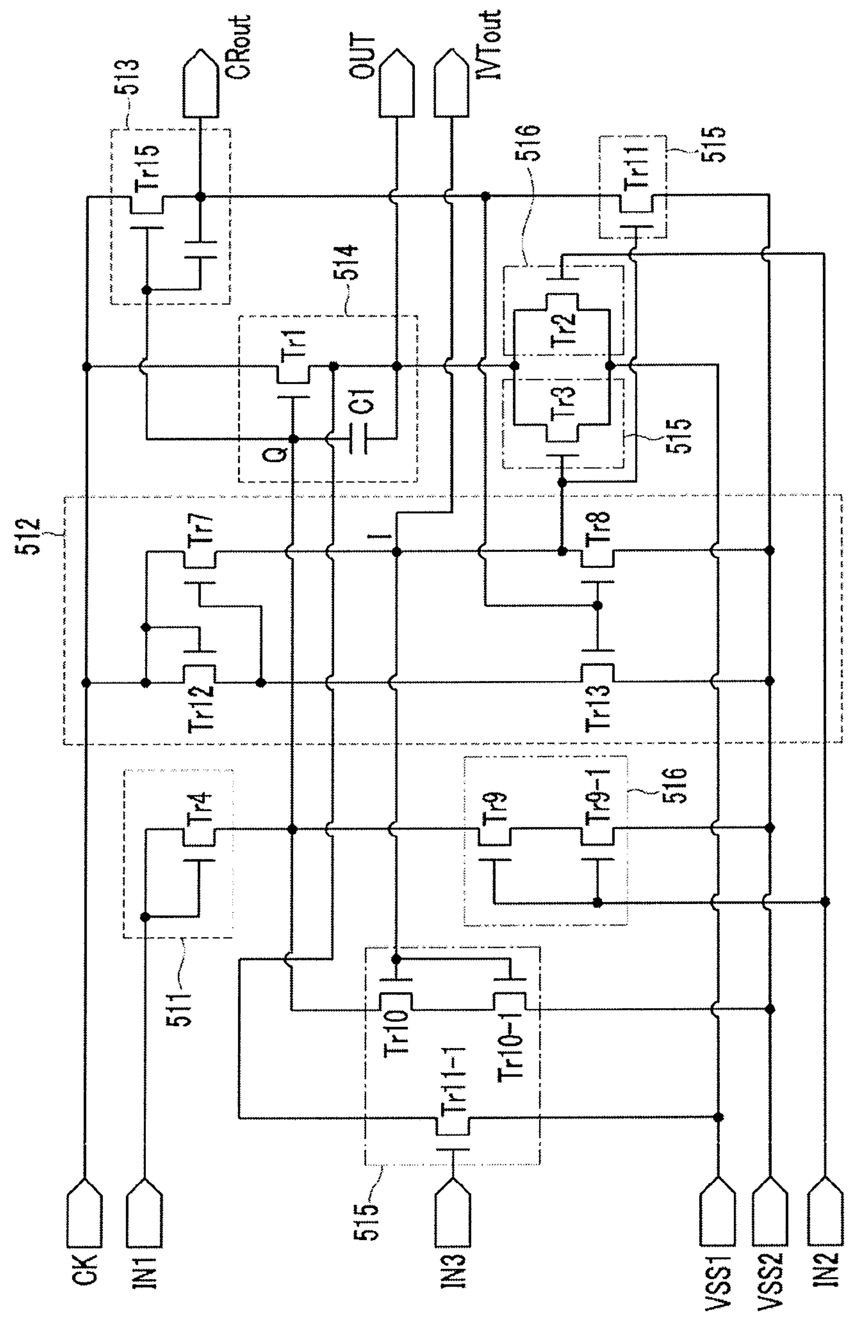

In the exemplary embodiment of FIG. 9, the seventeenth transistor Tr17 is removed when compared with the exemplary embodiment of FIG. 3.

In the exemplary embodiment of FIG. 3, the seventeenth transistor Tr17 decreases the transmitting signal CR of the current stage to the second low voltage Vss2 by the transmitting signal CR of a next stage. However, the eleventh transistor Tr11 may decrease the transmitting signal CR to the second low voltage by an output (a voltage of the node I) of the inverter, and thus, the exemplary embodiment of FIG. 9 without the seventeenth transistor Tr17 may be used.

According to an exemplary embodiment, the output terminal of the ninth-1 transistor Tr9-1 may be connected to the first voltage input terminal Vin1.

Figure 10:
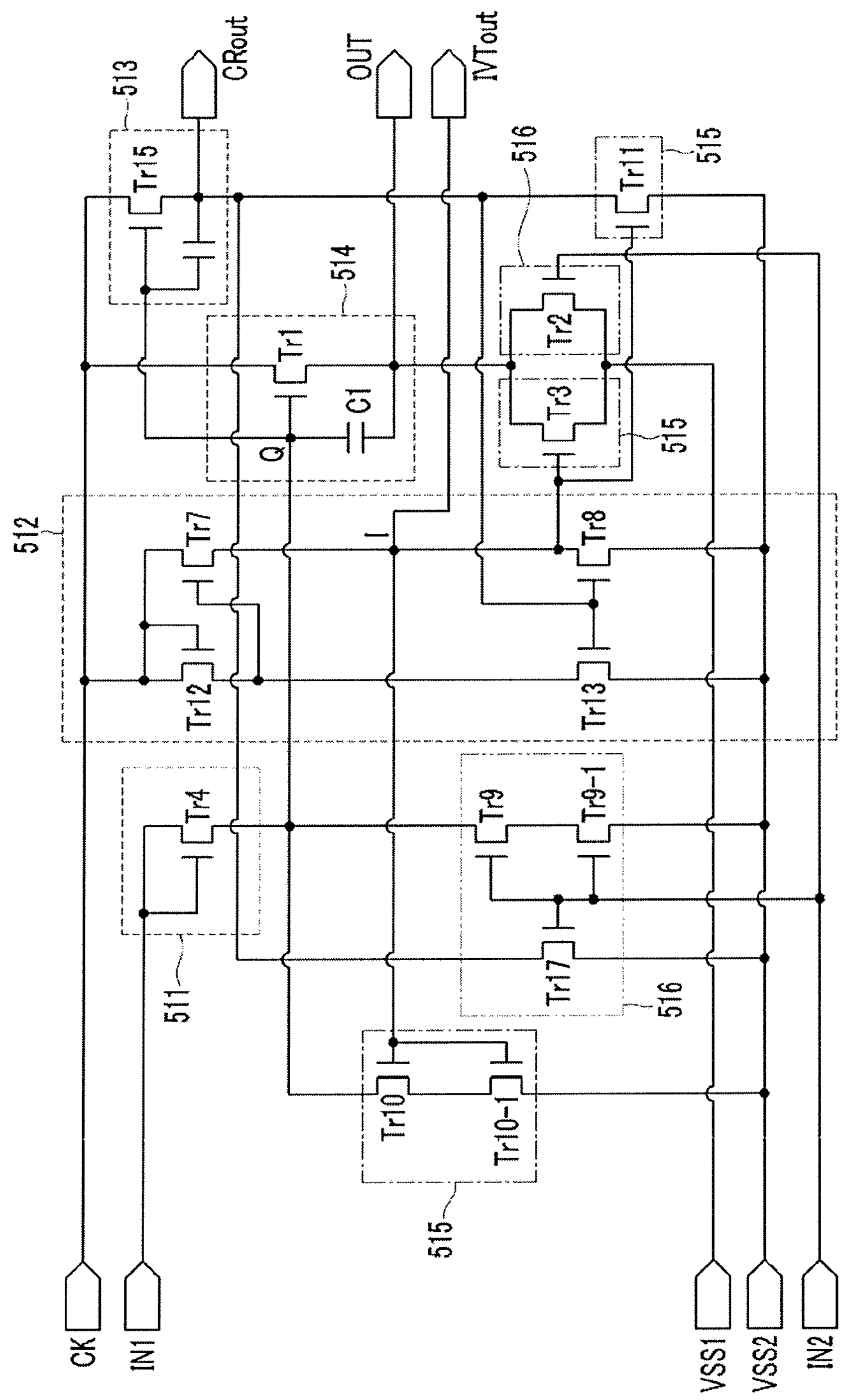

In the exemplary embodiment of FIG. 10, the eleventh-1 thin film transistor Tr11-1 is removed when compared with the exemplary embodiment of FIG. 3.

The eleventh-1 transistor Tr11-1 decreases a voltage of the gate voltage output terminal OUT to the first low voltage Vss1 according to a voltage of the node I (the inverter output) of a previous stage, and the gate voltage is decreased to the low voltage by an inverter output of the previous stage that is generated by an inversion clock. However, according to an embodiment, the transistor for decreasing the gate voltage output to the first low voltage may be omitted since the second and third transistors Tr2 and Tr3 may also decrease the gate voltage output to the first low voltage.

In the exemplary embodiment of FIG. 10, the output terminal of the ninth-1 transistor Tr9-1 may be connected to the first voltage input terminal Vin1 like the exemplary embodiment of FIG. 8 or the seventeenth transistor Tr17 may be removed like the exemplary embodiment of FIG. 9.

Figure 11:
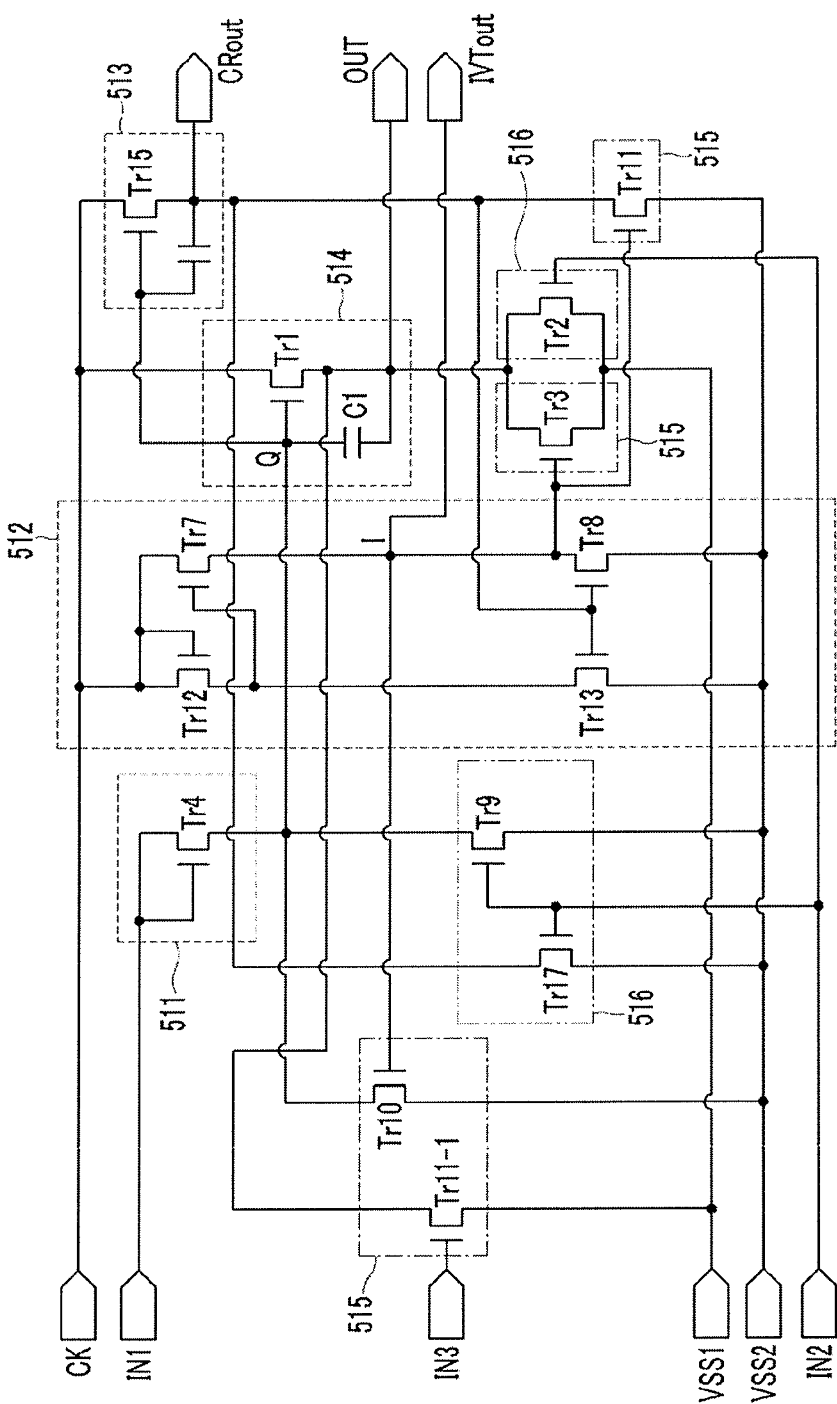

Meanwhile, in the exemplary embodiment of FIG. 11, the ninth-1 and tenth-1 transistors Tr9-1 and Tr10-1 are removed when compared with the exemplary embodiment of FIG. 3.

In FIG. 11, the pair of transistors that are additional connected in the exemplary embodiment of FIG. 3 is replaced with one transistor. In FIG. 3, the transistor pair Tr9 and Tr9-1, and the transistor pair Tr10 and Tr10-1 are used to reduce the leakage current. However, alternatively, rather than using the pairs of transistors, a thin film transistor may be formed with an increased width or length of a channel. According to an exemplary embodiment, only one of the ninth-1 thin film transistor and the tenth-1 thin film transistor may be removed.

In an exemplary embodiment of the present invention, the output terminal of the ninth-1 transistor Tr9-1 may be connected to the first voltage input terminal Vin1 like in the exemplary embodiment of FIG. 8, and the seventeenth transistor Tr17 may be removed like in the exemplary embodiment of FIG. 9.

Figure 12:
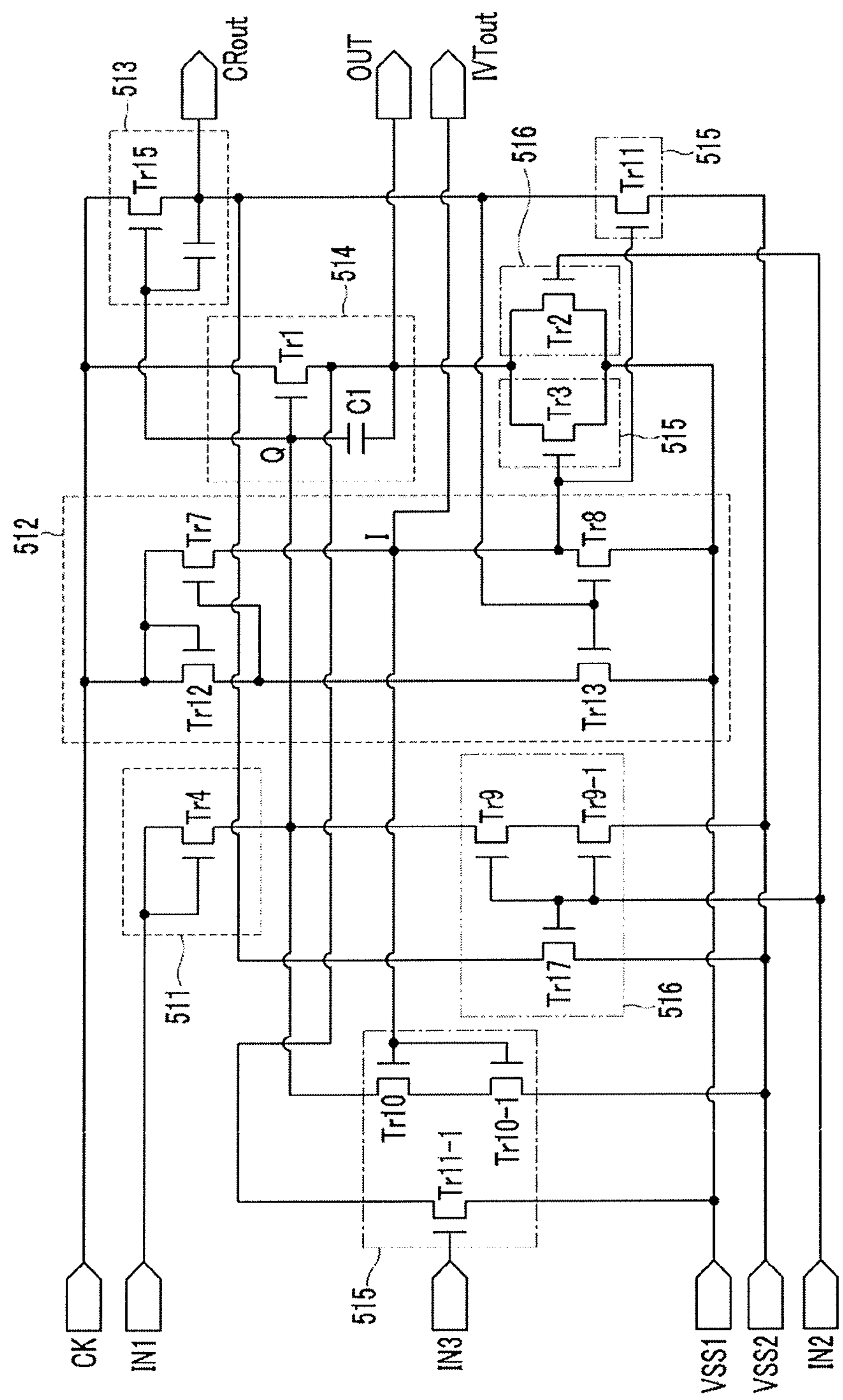

In the exemplary embodiment of FIG. 12, compared with the exemplary embodiment of FIG. 3, the inverter unit 512 is connected not to the second low voltage Vss2, but to the first low voltage Vss1. The output terminals of the eighth and thirteenth transistors Tr8 and Tr13 of the inverter unit 512 are connected to the second voltage input terminal Vin2. In the exemplary embodiment of FIG. 12, a voltage of the node I is decreased to the first low voltage Vss1, and thus, a transistor having a control terminal for receiving the voltage of the node I may be influenced. A voltage difference between the control terminal and the output terminal of the tenth and tenth-1 transistors Tr10 and Tr10-1 is generated, and thus a leakage current may be generated. However, when the transistors not using an oxide semiconductor are used, no leakage current is generated, or even though the transistors using an oxide semiconductor are used, the leakage current may be reduced, e.g., by additional-connecting a pair of transistors as shown in FIG. 3.

In an exemplary embodiment of the present invention, the output terminal of the ninth-1 transistor Tr9-1 may be connected to the first voltage input terminal Vin1 like in the exemplary embodiment of FIG. 8, the seventeenth transistor Tr17 may be removed like in the exemplary embodiment of FIG. 9, the ninth-1 or tenth-1 transistor Tr9-1 or Tr10-1 may be removed like in the exemplary embodiment of FIG. 11, or the output terminal of the eighth and thirteenth transistor Tr8 and Tr13 may be connected to the second voltage input terminal Vin2 like in the exemplary embodiment of FIG. 11.

Different from the exemplary embodiments of FIG. 8 to FIG. 12, a transistor that is operated by receiving a transmitting signal CR of a second next stage may be included in each stage.

Figure 13:
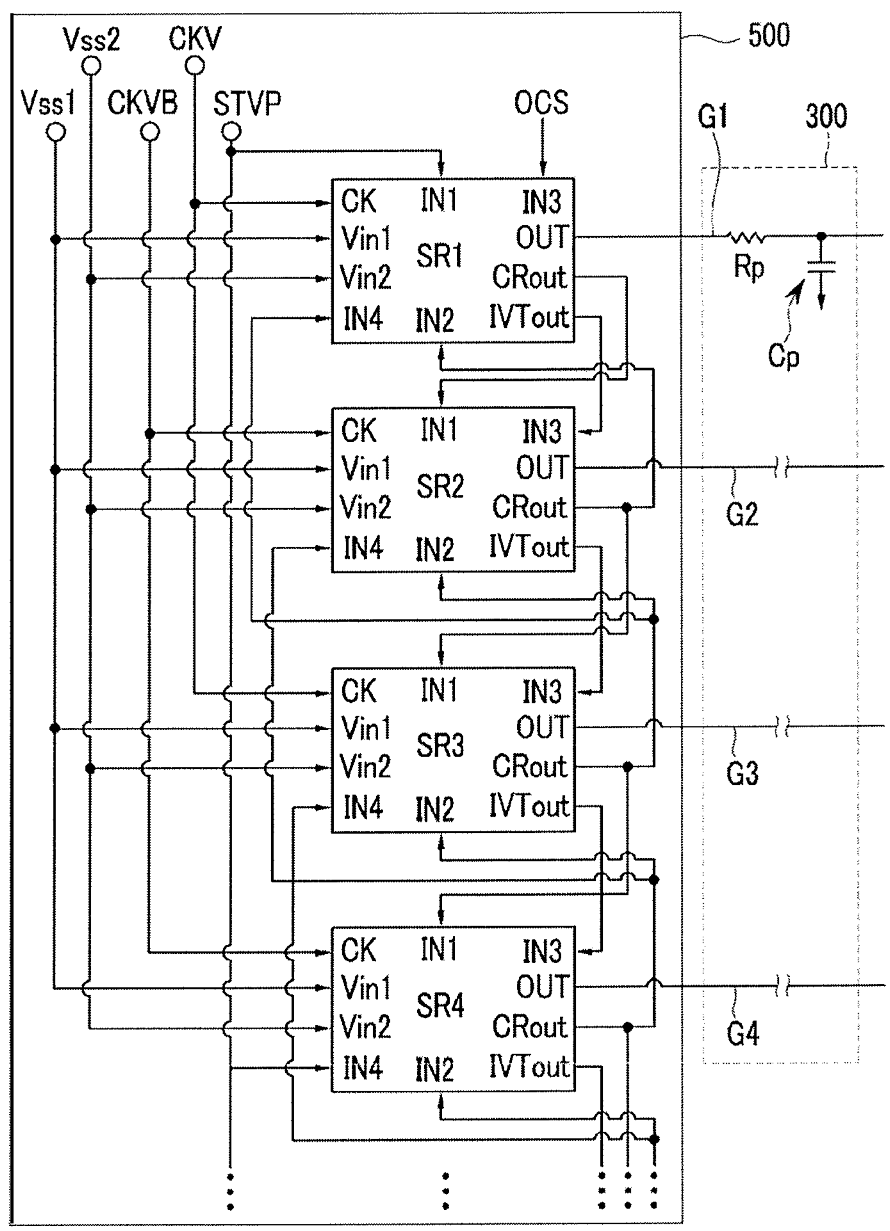
FIG. 13 is a block diagram illustrating a gate driver and gate lines according to an exemplary embodiment.
Figure 14:
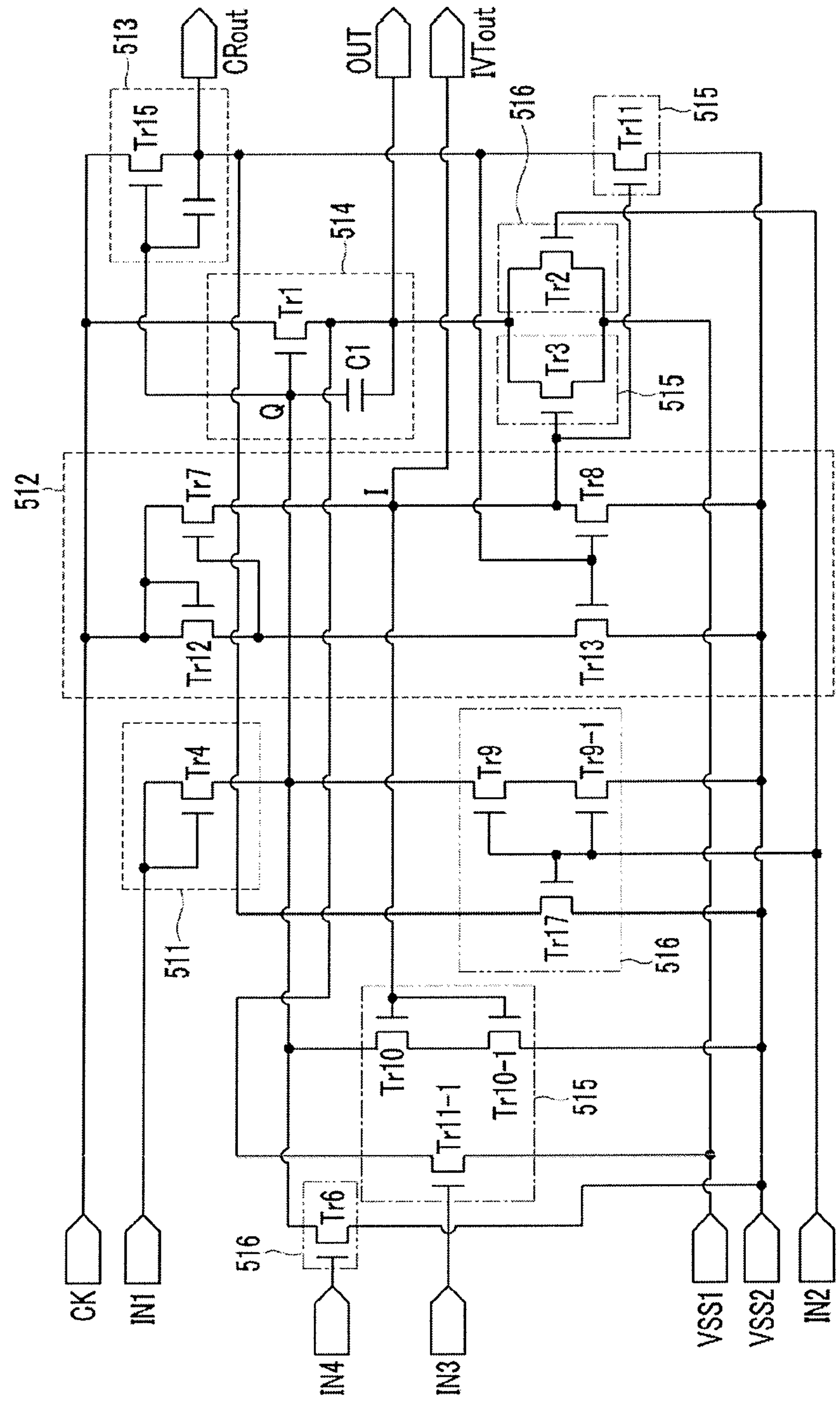
FIG. 14 is an enlarged circuit diagram illustrating a stage in the gate driver of FIG. 13.

FIG. 13 is a block diagram illustrating a gate driver and gate lines according to an exemplary embodiment, and FIG. 14 is an enlarged circuit diagram illustrating a stage in the gate driver of FIG. 13.

The gate driver 500 includes a plurality of stages SR1, SR2, SR3, SR4, that are dependently connected to each other. Each of the stages SR1, SR2, SR3, SR4, . . . includes four input terminals IN1, IN2, IN3, and IN4, one clock input terminal CK, two voltage input terminals Vin1 and Vin2, a gate voltage output terminal OUT outputting the gate voltage, a transmission signal output terminal CRout, and an inverter signal output terminal IVTout.

The first input terminal IN1 is connected to the transmission signal output terminal CRout of a previous stage, and receives the transmission signal CR of the previous stage. The first stage does not have a previous stage, and thus, the scan start signal STVP is applied to the first input terminal IN1.

The second input terminal IN2 is connected to the transmission signal output terminal CRout of a next stage, and receives the transmission signal CR of the next stage. The fourth input terminal IN4 is connected to the transmission signal output terminal CRout of a second next stage, and receives the transmission signal CR of the second next stage.

A stage SR(n−1) connected to the (n−1)-th gate line Gn−1 and a stage SRn connected to the n-th gate line Gn may have two dummy stages to receive the transmission signal CR from the next stage and the second next stage. The dummy stages SR(n+1) and SR(n+2) (not shown) generate and output a dummy gate voltage, different from the different stages SR1-SRn. The gate voltage outputs from the stages SR1-SRn are transmitted through the gate lines, and thus, data voltages are applied to the pixels for the display of images. However, the dummy stages SR(n+1) and SR(n+2) are not necessarily connected to the gate lines, or may be connected to gate lines of dummy pixels that do not display images.

The third input terminal IN3 is connected to an inverter signal output terminal IVTout of a previous stage and receives the inverter signal IVT of the previous stage. The first stage does not have a previous stage and thus a separate signal may be generated and input to the first stage, or the dummy stages SR(n+1) and SR(n+2) may generate a signal having an appropriate timing and the signal may be transmitted to the first stage. A signal input to the third input terminal IN3 of the first stage may be the second low voltage Vss2 during a section 1 H when the first gate line G1 is applied with the gate-on voltage and a high voltage (which may vary according to an exemplary embodiment. The high voltage is about 20 V in the present exemplary embodiment) of the transmission signal CR during a next section 1 H. As described above, during the section 1 H when the gate-on voltage is applied from a corresponding stage, the signal having a timing when a low voltage Vss1 or Vss2 is applied is hereinafter referred to as an output control signal OCS, and the output control signal OCS may have a timing when a high voltage (a high voltage of the transmission signal CR or a gate-on voltage) is applied during the section 1 H after the gate-on voltage is applied according to an exemplary embodiment. Hereafter, for example, as a signal having the characteristics of the output control signal OCS, the inverter signal IVT of a previous stage or a current stage is used. However, the embodiments of the present invention are not limited thereto.

The clock terminals CK are applied with a clock signal, and among the plurality of stages, the clock terminals CK of the odd-numbered stages are applied with the first clock signal CKV and the clock terminals CK of the even-numbered stages are applied with the second clock signal CKVB. The first clock signal CKV and the second clock signal CKVB have opposite phases to each other.

The first voltage input terminal Vin1 is applied with the first low voltage Vss1 corresponding to the gate-off voltage, and the second voltage input terminal Vin2 is applied with the second low voltage Vss2 that is lower than the first low voltage Vss1. The first low voltage Vss1 and the second low voltage Vss2 may have various values, and in the present exemplary embodiment, the first low voltage Vss1 is about −6 V and the second low voltage Vss2 is about −10 V. The second low voltage Vss2 is lower than the first low voltage Vss1.

The first stage SR1 receives the first clock signal CKV provided from the outside through the clock input terminal CK, the scan start signal STVP through the first input terminal IN1, the first and second low voltages Vss1 and Vss2 through the first and second voltage input terminals Vin1 and Vin2, the transmission signals CR respectively provided from the second stage SR2 and the third stage SR3 through the second and fourth input terminals IN2 and IN4, and the output control signal through the third input terminal IN3, and thus, the gate-on voltage is output to the first gate line through the gate voltage output terminal OUT. The transmission signal output terminal CRout outputs the transmission signal CR, and the transmission signal CR is transmitted to the first input terminal IN1 of the second stage SR2, and the inverter signal IVT is transmitted to the third input terminal IN3 of the second stage SR2 from the inverter signal output terminal IVTout.

The second stage SR2 receives the second clock signal CKVB provided from the outside through the clock input terminal CK, the transmission signal CR of the first stage SR1 through the first input terminal IN1, the first and second low voltages Vss1 and Vss2 through the first and second voltage input terminals Vin1 and Vin2, the transmission signals CR respectively provided from the third stage SR3 and the fourth stage SR4 through the second and fourth input terminals IN2 and IN4, and the inverter signal IVT provided from the first stage SR1 through the third input terminal IN3, and thus, the gate-on voltage is output to the second gate line through the gate voltage output terminal OUT. The transmission signal CR is output through the transmission signal output terminal CRout and is transmitted to the first input terminal IN1 of the third stage SR3 and the second input terminal IN2 of the first stage SR1, and the inverter signal IVT is transmitted to the third input terminal IN3 of the third stage SR3 from the inverter signal output terminal IVTout.

The third stage SR3 receives the first clock signal CKV provided from the outside through the clock input terminal CK, the transmission signal CR of the second stage SR2 through the first input terminal IN1, the first and second low voltages Vss1 and Vss2 through the first and second voltage input terminals Vin1 and Vin2, the transmission signals CR respectively provided from the fourth stage SR4 and the fifth stage SR5 through the second and fourth input terminals IN2 and IN4, and the inverter signal IVT provided from the second stage SR2 through the third input terminal IN3, and thus, the gate-on voltage is output to the third gate line through the gate voltage output terminal OUT. The transmission signal CR is output through the transmission signal output terminal CRout and is transmitted to the first input terminal IN1 of the fourth stage SR4, the fourth input terminal IN4 of the first stage SR1, and the second input terminal IN2 of the second stage SR2, and the inverter signal IVT is transmitted to the third input terminal IN3 of the fourth stage SR4 from the inverter signal output terminal IVTout.

Through the above method, the n-th stage SRn receives the second clock signal CKVB provided from the outside through the clock input terminal CK, the transmission signal CR of the (n−1)-th stage SR2 through the first input terminal IN1, the first and second low voltages Vss1 and Vss2 through the first and second voltage input terminals Vin1 and Vin2, the transmission signals CR respectively provided from the (n+1)-th stage SR(n+1) (the dummy stage) and the (n+2)-th stage SR(n+2) (the dummy stage) through the second and fourth input terminals IN2 and IN4, and the inverter signal IVT provided from the (n−1)-th stage SRn−1 through the third input terminal IN3, and thus, the gate-on voltage is output to the n-th gate line through the gate voltage output terminal OUT. The transmission signal CR is output through the transmission signal output terminal CRout and is transmitted to the first input terminal IN1 of the (n+1)-th stage SR(n+1) (the dummy stage), the fourth input terminal IN4 of the (n−2)-th stage SR(n−2), and the second input terminal IN2 of the (n−1)-th stage SR(n−1), and the inverter signal IVT is transmitted to the (n+1)-th stage SRn+1 (the dummy stage) from the inverter signal output terminal IVTout.

A structure of a stage SR of a gate driver connected to a gate line is described in further detail with reference to FIG. 14.

In the exemplary embodiment of FIG. 14, the sixth transistor Tr6 is additionally formed, different from FIG. 3. The sixth transistor Tr6 includes the control terminal connected to the fourth input terminal IN4, the input terminal connected to the node Q, and the output terminal connected to the second voltage input terminal Vin2 and the second low voltage Vss2. Thus, the voltage of the node Q is decreased to the second low voltage Vss2 by the transmitting signal CR of the second next stage. The sixth transistor Tr6 is included in the pull-down unit 516.

Each stage SR of the gate driver 500 according to the exemplary embodiment of FIG. 14 includes the input unit 511, the inverter unit 512, the transmitting signal generator 513, the output unit 514, the noise removal unit 515, and the pull-down unit 516.

The input section 511 includes one transistor (the fourth transistor Tr4). The input terminal and the control terminal of the fourth transistor Tr4 are commonly connected (diode-connected) to the first input terminal IN1, and the output terminal of the fourth transistor Tr4 is connected to a node Q (hereinafter referred to as the first node). The input section 511 transmits a high voltage to the node Q when the first input terminal IN1 is applied with the high voltage.

The inverter unit 512 includes four transistors (the twelfth transistor Tr12, the seventh transistor Tr7, the eighth transistor Tr8, and the thirteenth transistor Tr13). The twelfth transistor Tr12 includes one terminal (an input terminal) that is connected to the control terminal by the diode connection connected to the clock input terminal CK and another terminal (an output terminal) connected to the control terminal of the seventh transistor Tr7 and the input terminal of the thirteenth transistor Tr13. The seventh transistor Tr7 includes the control terminal connected to the output terminal of the twelfth transistor Tr12, the input terminal connected to the clock input terminal CK, and the output terminal connected to a node I (referred to as the inverter node or the second node). The eighth transistor Tr8 includes the control terminal connected to the transmitting signal output terminal CRout of the current stage, the input terminal connected to the node I, and the output terminal connected to the second voltage input terminal Vin2. The thirteenth transistor Tr13 includes the input terminal connected to the output terminal of the twelfth transistor Tr12, the control terminal connected to the transmitting signal output terminal CRout of the current stage, and the output terminal connected to the second voltage input terminal Vin2. By this connection, when a high signal is applied as a clock signal, the clock signal is transmitted to the input terminals of the eighth and thirteenth transistors Tr8 and Tr13 by the twelfth and seventh transistors Tr12 and Tr7, and thus, the node I has the high voltage. The transmitted high signal decreases the voltage of the node I to the second low voltage VSS2 when the transmitting signal CR is output from the transmitting signal output terminal CRout of the current stage. Thus, the node I of the inverter unit 512 has an opposite voltage level to a voltage level of the transmitting signal CR of the current stage and the gate-on voltage.

The transmission signal generator 513 includes one transistor (the fifteenth transistor Tr15). The input terminal of the fifteenth transistor Tr15 is connected to the clock terminal CK and receives the first clock signal CKV or the second clock signal CKVB, the control terminal of the fifteenth transistor Tr15 is connected to the output terminal of the input section 511, e.g., the node Q, and the output terminal of the fifteenth transistor Tr15 is connected to the transmission signal output terminal CRout outputting the transmission signal CR. A parasitic capacitance may be generated between the control terminal and the output terminal of the fifteenth transistor Tr15. The output terminal of the fifteenth transistor Tr15 is connected to the noise removal unit 515, the pull-down unit 516, and the transmitting signal output terminal CRout, and receives the second low voltage Vss2. Thus, the voltage value is the second low voltage Vss2 when the transmission signal CR is low.

The output unit 514 includes a transistor (the first transistor Tr1) and a capacitor (the first capacitor C1). The control terminal of the first transistor Tr1 is connected to the node Q. The input terminal of the first transistor Tr1 receives the first clock signal CKV or the second clock signal CKVB through the clock terminal CK. The first capacitor C1 is formed between the control terminal and the output terminal of the first transistor Tr1. The output terminal of the first transistor Tr1 is connected to the gate voltage output terminal OUT. The output terminal of the first transistor Tr1 is connected to the noise removal unit 515 and the pull-down unit 516, and is thus connected to the first voltage input terminal Vin1 through the noise removal unit 515 and the pull-down unit 516. Thus, the voltage of the gate-off voltage is the first low voltage Vss1. The output unit 514 outputs the gate voltage according to a voltage of the node Q and the first clock signal CKV. A voltage difference is generated between the control terminal and the output terminal of the first transistor Tr1 by the voltage of the node Q, and when the voltage difference is charged to the first capacitor C1 and then the high voltage is applied by the clock signal, the high voltage is output as the gate-on voltage while the charged voltage is boosted.

The noise removal unit 515 is controlled by the output of the node I. The noise removal unit 515 includes five transistors (the third transistor Tr3, the tenth and tenth-1 transistors Tr10 and Tr10-1, the eleventh transistor Tr11, and the eleventh-1 transistor Tr11-1). The third transistor Tr3 includes the control terminal connected to the node I, the input terminal connected to the gate voltage output terminal OUT, and the output terminal connected to the first voltage input terminal Vin1. The third transistor Tr3 changes a voltage of the gate voltage output terminal OUT to the first low voltage Vss1 according to a voltage of the node I. The tenth and tenth-1 transistors Tr10 and Tr10-1 constitute a transistor pair, in which the input terminal of the transistor Tr10 or Tr10-1 may be connected to the output terminal of the transistor Tr10-1 or Tr10, and the control terminals of the transistors Tr10 and Tr10-1 are connected to the same terminal (such connection between the transistors is hereinafter referred to as an additional connection). The control terminals of the transistors Tr10 and Tr10-1 are connected to the node I. The input terminal of the transistor pair is connected to the node Q, and the output terminal of the transistor pair is connected to the second voltage input terminal Vin2. The tenth and tenth-1 transistors Tr10 and Tr10-1 change a voltage of the node Q to the second low voltage Vss2 according to a voltage of the node I. A pair of additional connected transistors share a voltage difference between the second low voltage and the node I, and thus, little or no leakage current may be generated from the node Q. The eleventh transistor Tr11 includes the control terminal connected to the node I, the input terminal connected to the transmitting signal output terminal CRout, and the output terminal connected to the second voltage input terminal Vin2. The eleventh transistor Tr11 changes a voltage of the transmitting signal output terminal CRout to the second low voltage Vss2 according to a voltage of the node I. The eleventh-1 transistor Tr11-1 includes the control terminal connected to the node I of a previous stage through the third input terminal IN3, the input terminal connected to the gate voltage output terminal OUT, and the output terminal connected to the first voltage input terminal Vin1. The eleventh-1 transistor Tr11-1 changes a voltage of the gate voltage output terminal OUT to the first low voltage Vss1 according to a voltage of the node I (the inverter output) of a previous stage. The third transistor Tr3 changes a voltage of the gate voltage output terminal OUT to the first low voltage Vss1 by the inverter output of the current stage, and the eleventh-1 transistor Tr11-1 changes a voltage of the gate voltage output terminal OUT to the first low voltage Vss1 by the inverter output of the previous stage.

The pull-down unit 516 is controlled by the transmitting signal CR of a next stage. The pull includes five transistors (the second transistor Tr2, the sixth transistor TR6, the ninth transistor Tr9, the ninth-1 transistor Tr9-1, and the seventeenth transistor Tr17). The second transistor Tr2 includes the control terminal connected to the second input terminal IN2, the input terminal connected to the gate voltage output terminal OUT, and the output terminal connected to the first voltage input terminal Vin1. The second transistor Tr2 changes the voltage of the gate voltage output terminal OUT to the first low voltage Vss1 according to the transmitting signal CR of the next stage. The sixth transistor Tr6 includes the control terminal connected to the fourth input terminal IN4, the input terminal connected to the node Q, and the output terminal connected to the second low voltage Vss2 connected to the second voltage input terminal Vin2. Thus, the voltage of the node Q is decreased to the second low voltage Vss2 by the transmitting signal CR of the second next stage. The ninth and ninth-1 transistors Tr9 and Tr9-1 constitute a transistor pair, in which the input terminal of the transistor Tr9 or Tr9-1 is connected to the output terminal of the transistor Tr9-1 or Tr9. The control terminals of the transistors Tr9 and Tr9-1 are connected to the same terminal. In other words, the transistors Tr9 and Tr9-1 are additional connected to each other. The control terminals of the transistors Tr9 and Tr9-1 are connected to the second input terminal IN2. The input terminal of the transistor pair is connected to the node Q, and the output terminal of the transistor pair is connected to the second voltage input terminal Vin2. A pair of additional connected transistors share a voltage difference (e.g., a low voltage difference) between the second low voltage and the carry signal of the next stage, and thus no or little leakage current is generated from the node Q. The seventeenth transistor Tr17 includes the control terminal connected to the second input terminal IN2, the input terminal connected to the transmitting signal output terminal CRout, and the output terminal connected to the second voltage input terminal Vin2.

In summary, the transmission signal generator 513 and the output unit 514 are operated by a voltage of the node Q, and one stage SR outputs a high voltage of the transmission signal CR and the gate-on voltage. The transmission signal CR is decreased from the high voltage to the second low voltage Vss2 by the transmission signals CR of the previous and next stages, and the gate-on voltage is decreased to the first low voltage Vss1 which then becomes a gate-off voltage.

The above structure may have the following characteristics.

The output terminals of the eighth transistor Tr8 and the thirteenth transistor Tr13 of the inverter unit 512 are connected to the second low voltage Vss2. Thus, the second low voltage Vss2 is provided as a low voltage of the node I. Thus, a transistor of the noise removal unit 515 having the control terminal for receiving a voltage of the node I as the output of the inverter is influenced. For example, in the tenth and tenth-1 transistors Tr10 and Tr10-1, no voltage level difference between a low voltage (the second low voltage Vss2) of voltages (the voltage of the node I) of the control terminal and the voltage (the second low voltage Vss2) of the output terminal is generated, and thus, no voltage difference occurs between the source electrode and the gate electrode of the thin film transistor. Thus, no leakage current is generated. This characteristic may be maintained when an oxide semiconductor is used in the channel layer of the thin film transistor. In general, a thin film transistor using an oxide semiconductor generates about ten times more leakage current than a thin film transistor using amorphous silicon does. The characteristics of a thin film transistor using an oxide semiconductor are shown in FIG. 4.

FIG. 4 is a graph illustrating a current versus a voltage of a thin film transistor including an oxide semiconductor, in which the horizontal axis represents a voltage difference between a gate electrode and a source electrode, and the vertical axis represents a current (a leakage current) between the source electrode and the drain electrode.

As shown in FIG. 4, the thin film transistor using the oxide semiconductor is sensitive to a change in the voltage, and the leakage current is suddenly decreased, and reducing the voltage difference between the gate electrode and the source electrode may reduce the leakage current.

Different from the eighth transistor Tr8 and the thirteenth transistor Tr13 of FIG. 3, when the output terminal is connected to the first low voltage Vss1, the low voltage of the node I is −5 V, and in this case, the tenth and tenth-1 transistors Tr10 and Tr10-1 are applied with the second low voltage Vss2 of −10 V and the control terminal is applied with the low voltage of −5 V, and thus, the voltage difference of 5 V is generated. Referring to FIG. 4, a relatively high leakage current is generated which is increased by about $10^4$ times. As shown in FIG. 3, the output terminals of the eighth transistor Tr8 and the thirteenth transistor Tr13 are connected to the second low voltage Vss2, and thus, the leakage current of the transistor included in the noise removal unit 515 may be reduced and a decrease in the gate-on voltage due to the current of the node Q may be prevented.

To reduce the current leakage of the node Q, as shown in FIG. 3, a pair of thin film transistors have a additional connected structure, in which the input terminal of one of the thin film transistors is connected to the output terminal of the other thin film transistor, and the control terminals of the thin film transistors are connected to the same terminal. For example, the ninth and ninth-1 transistors and the tenth and tenth-1 transistors shown in FIG. 3 have the additional connected structure. Two pairs of transistors decrease a voltage of the node Q to the second low voltage Vss2. The ninth and ninth-1 transistors Tr9 and Tr9-1 are operated according to the transmitting signal CR of a next stage, and the tenth and tenth-1 transistors Tr10 and Tr10-1 are operated by an inverter output (a voltage of the node I). The pairs of transistors having the additional connected structure may further decrease the leakage current compared with when the transistors are formed individually. For example, a leakage current may be generated even when a transistor is in the turn-off state due to a voltage difference between a voltage applied to the control terminal of the transistor and the second low voltage. When two transistors are additional connected to each other, the two transistors share the voltage difference, and thus, the leakage current may be decreased through these transistors. For example, in a thin film transistor using an oxide semiconductor, as shown in FIG. 4, the leakage current is exponentially increased according to an increase in the voltage, however when the voltage is decreased by half, the leakage current may be decreased by more than half.

Also, in the exemplary embodiment of FIG. 3, by using the voltage (the inverter output) of the node I of the previous stage by the eleventh-1 transistor Tr11-1, the period that is floated is maintained to not be floated in the present stage, and thereby the gate voltage is stabilized. Accordingly, the gate voltage may be maintained as the low voltage for noise that is generated while the clock signal is inverted.

Also, in the exemplary embodiment of FIG. 3, by using the seventeenth transistor Tr17, a noise (glitch noise) generated in the output terminal of the transmitting signal CR by the delay of the clock signal is removed based on the transmitting signal CR of the next stage.

Also, in the exemplary embodiment of FIG. 3, a transistor and wiring lines for stabilizing the current stage by using the signal, for example, the transmitting signal CR, of the second next stage is omitted. According to an exemplary embodiment, the node Q of the current stage or the voltage of the node I may be stabilized by this transistor, however in the exemplary embodiment of FIG. 3, the transistor and wiring lines are omitted to simplify the wiring connection between the stages, and one transistor may be omitted from the stage thereby reducing the size thereof. Thus, the size of the gate driver included in the peripheral area around the display area for displaying the image in the display device may be reduced to thus obtain a reduced bezel.

In the exemplary embodiment of FIG. 3, the output terminals of the ninth and ninth-1 transistors are connected to the second low voltage Vss2, and thus, a delay of a time during which the gate voltage is decreased by a delay generated at the node Q may be reduced. The voltage of the node Q is decreased to the low voltage, and thus, the gate voltage is quickly decreased to the low voltage. Thus, the size of the transistor, e.g., the second transistor Tr2, for pulling down the voltage of the gate voltage output terminal OUT may be reduced. By reducing the size of the transistor included in the stage, the size of each stage is decreased, and thus, the bezel of a display device may be reduced.

Also, a voltage of the node Q is decreased to the second low voltage Vss2 according to the transmitting signal CR of the second next stage by the sixth transistor Tr6, and thus, the voltage of the node Q may be further stabilized. When compared with the embodiments described above in connection with FIG. 2 and FIG. 13, a signal is input from the second next stage, and thus, a region where the gate driver 500 may be formed may be increased.

The exemplary embodiment of FIG. 14 may have similar result values to result values obtained from the exemplary embodiment of FIG. 3 since the embodiments of FIGS. 3 and 14 are similar to each other except the sixth transistor Tr6 is provided in the embodiment of FIG. 14, which compensates for the pull-down unit 516.

FIG. 15 to FIG. 19 are enlarged circuit diagrams illustrating a stage in a gate driver according to exemplary embodiments of the present invention.

Figure 15:
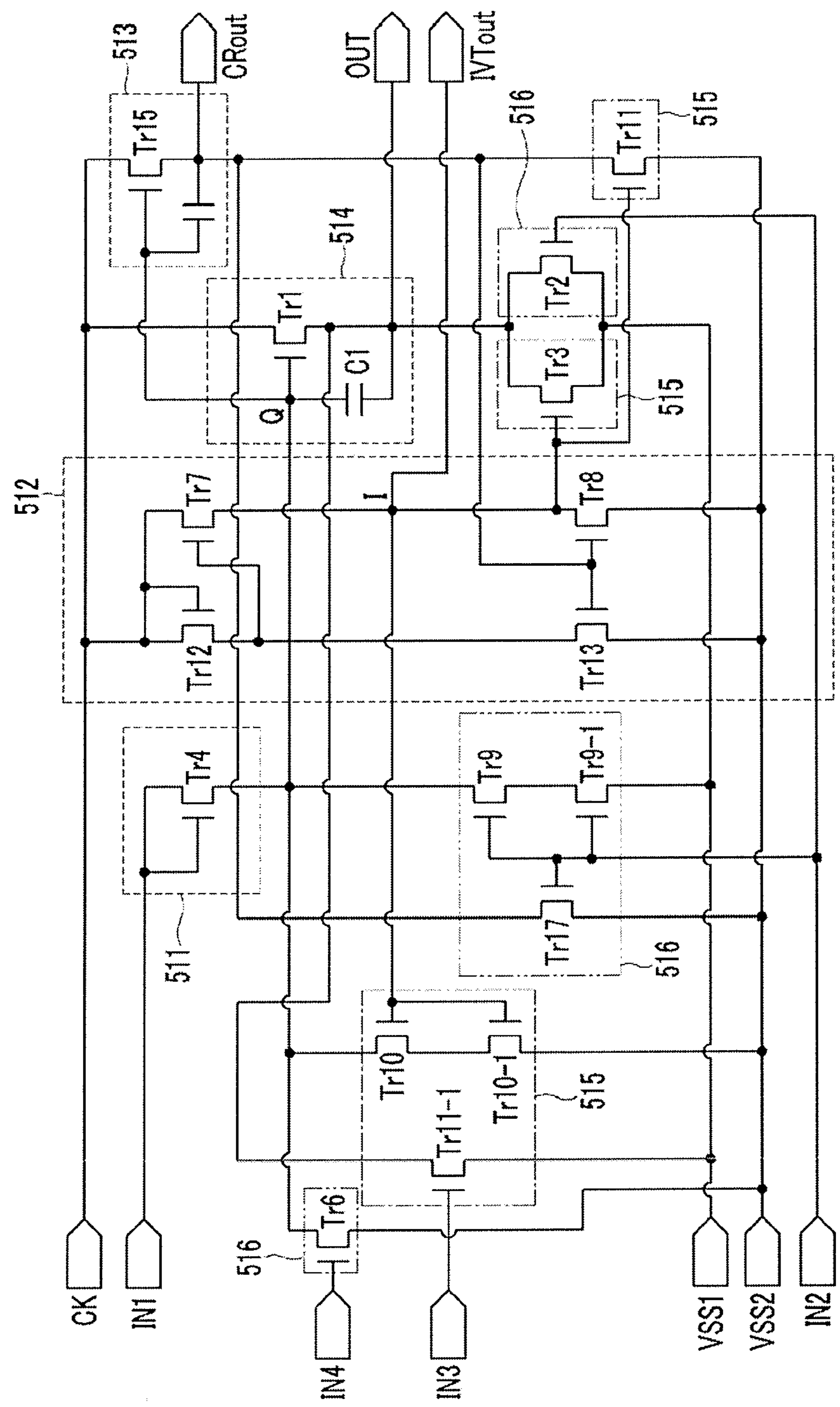
FIG. 15 to FIG. 19 are enlarged circuit diagrams illustrating a stage in a gate driver according to exemplary embodiments of the present invention.

The exemplary embodiment of FIG. 15 is different from the embodiment of FIG. 14 in that the output terminal of the ninth-1 transistor Tr9-1 is connected to the first voltage input terminal Vin1, differently from FIG. 14.

Thus, a pair of transistors Tr9 and Tr9-1 that are additional connected to each other allows a voltage of the node Q of the current stage to be decreased to the first low voltage Vss1 by the transmitting signal CR of the next stage.

According to the exemplary embodiment of FIG. 15, the voltage of the node Q is decreased to the second low voltage Vss2 by the ninth and ninth-1 transistors Tr9 and Tr9-1, and thus, a delay may be generated when the voltage of the node Q is decreased to the low voltage. However, transistors of the pull-down unit 516 may prevent malfunctions from occurring in the stage. As shown in FIG. 5 to FIG. 7, the output of the gate-on voltage is not changed even in the comparative example.

Figure 16:
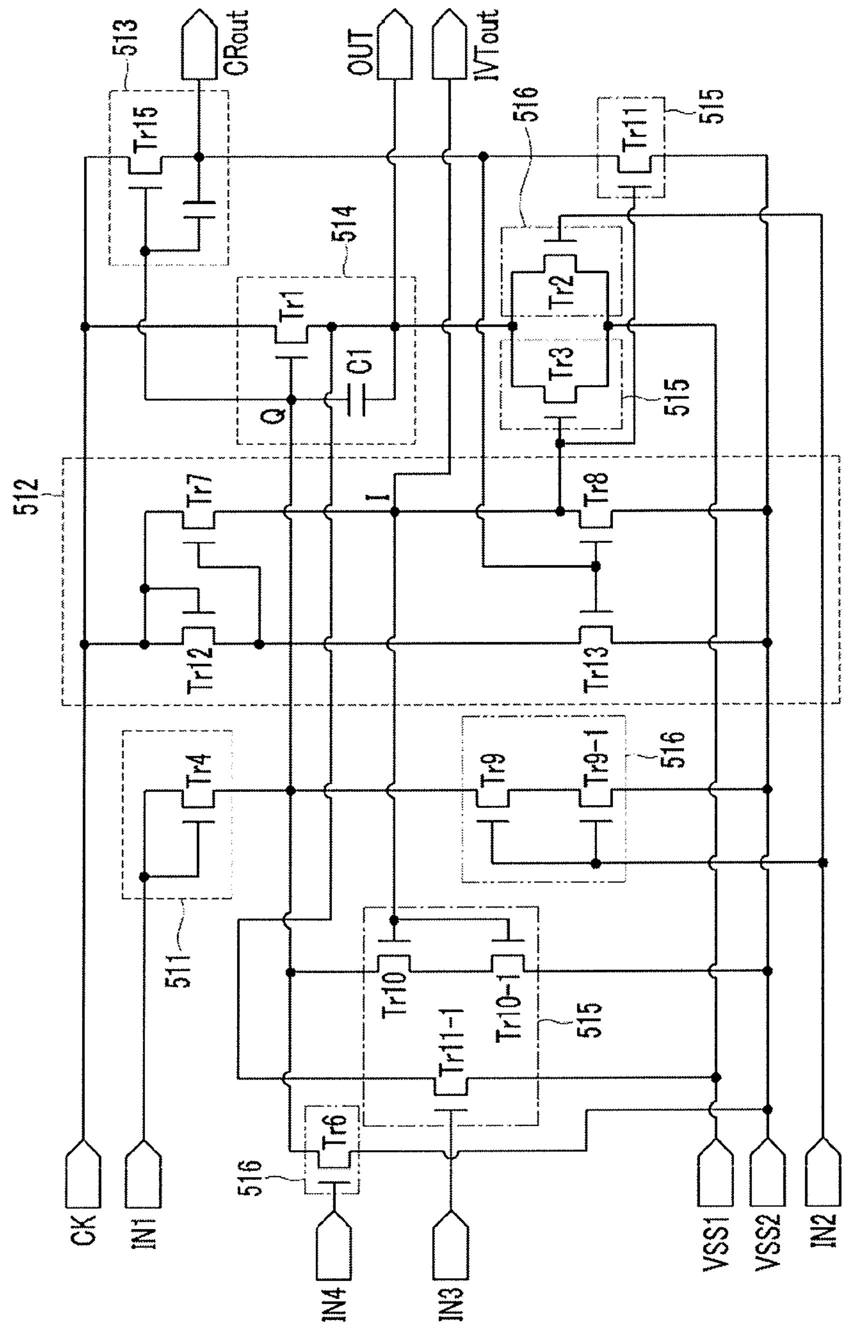

In the exemplary embodiment of FIG. 16, the seventeenth transistor Tr17 is removed when compared with the exemplary embodiment of FIG. 14.

In the exemplary embodiment of FIG. 14, the seventeenth transistor Tr17 decreases the transmitting signal CR of the current stage to the second low voltage Vss2 by the transmitting signal CR of the next stage. However, the eleventh transistor Tr11 may decrease the transmitting signal CR to the second low voltage by the output (the voltage of the node I) of the inverter exists in the exemplary embodiment of FIG. 16.

Like in the exemplary embodiment of FIG. 15, the exemplary embodiment of FIG. 16 may have the output terminal of the ninth-1 transistor Tr9-1 connected to the first voltage input terminal Vin1.

Figure 17:
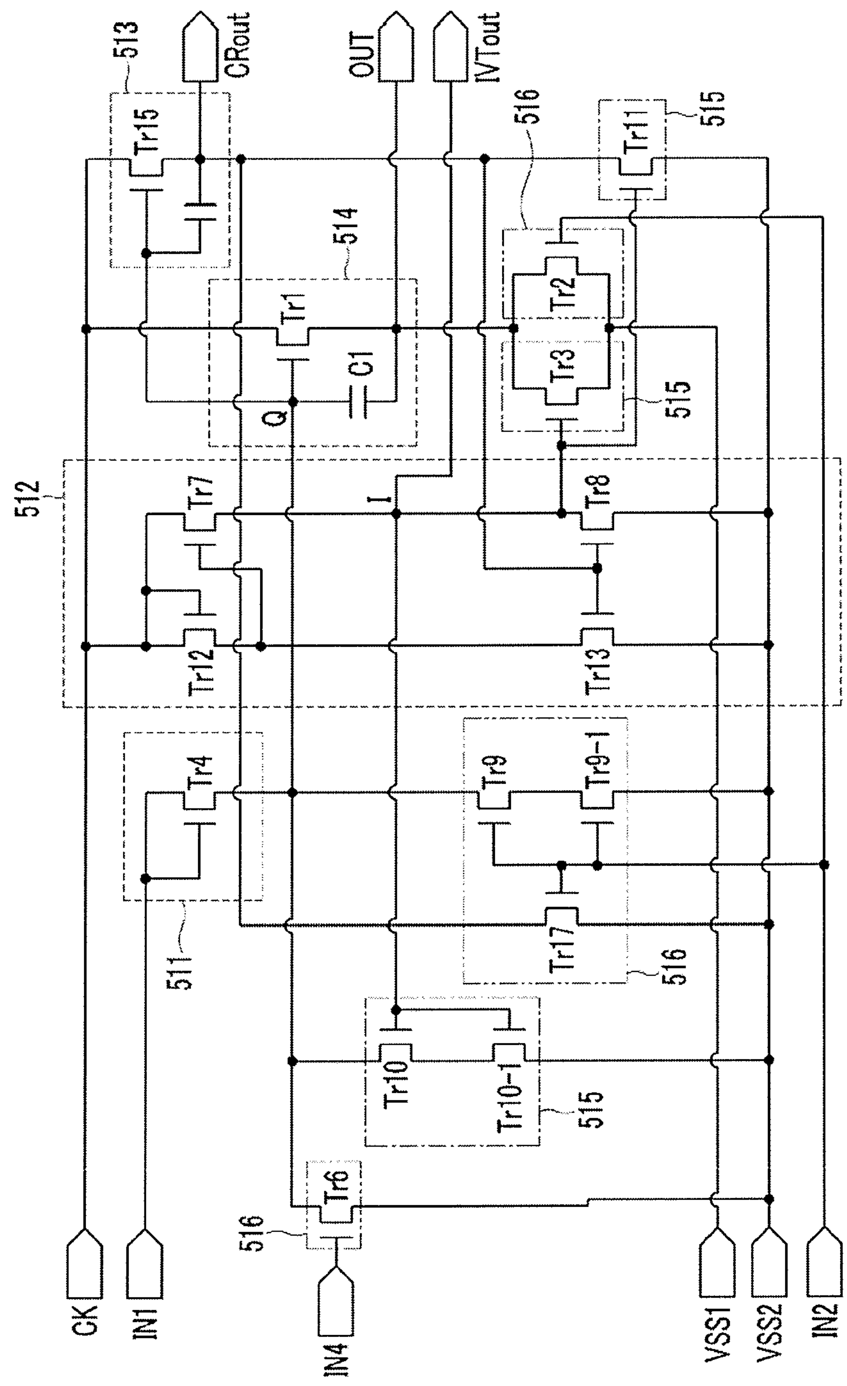

In the exemplary embodiment of FIG. 17, the eleventh-1 thin film transistor Tr11-1 is removed when compared with the exemplary embodiment of FIG. 14.

The eleventh-1 transistor Tr11-1 decreases the voltage of the gate voltage output terminal OUT to the first low voltage Vss1 according to the voltage of the node I (the inverter output) of the previous stage, and the gate voltage is decreased to the low voltage by the inverter output of the previous stage that is generated by an inversion clock. In the embodiment of FIG. 17, the second and third transistors Tr2 and Tr3 may decrease the gate voltage output to the first low voltage.

In the exemplary embodiment of FIG. 17, the output terminal of the ninth-1 transistor Tr9-1 may be connected to the first voltage input terminal Vint like in the exemplary embodiment of FIG. 8, or the seventeenth transistor Tr17 may be removed like in the exemplary embodiment of FIG. 15.

Figure 18:
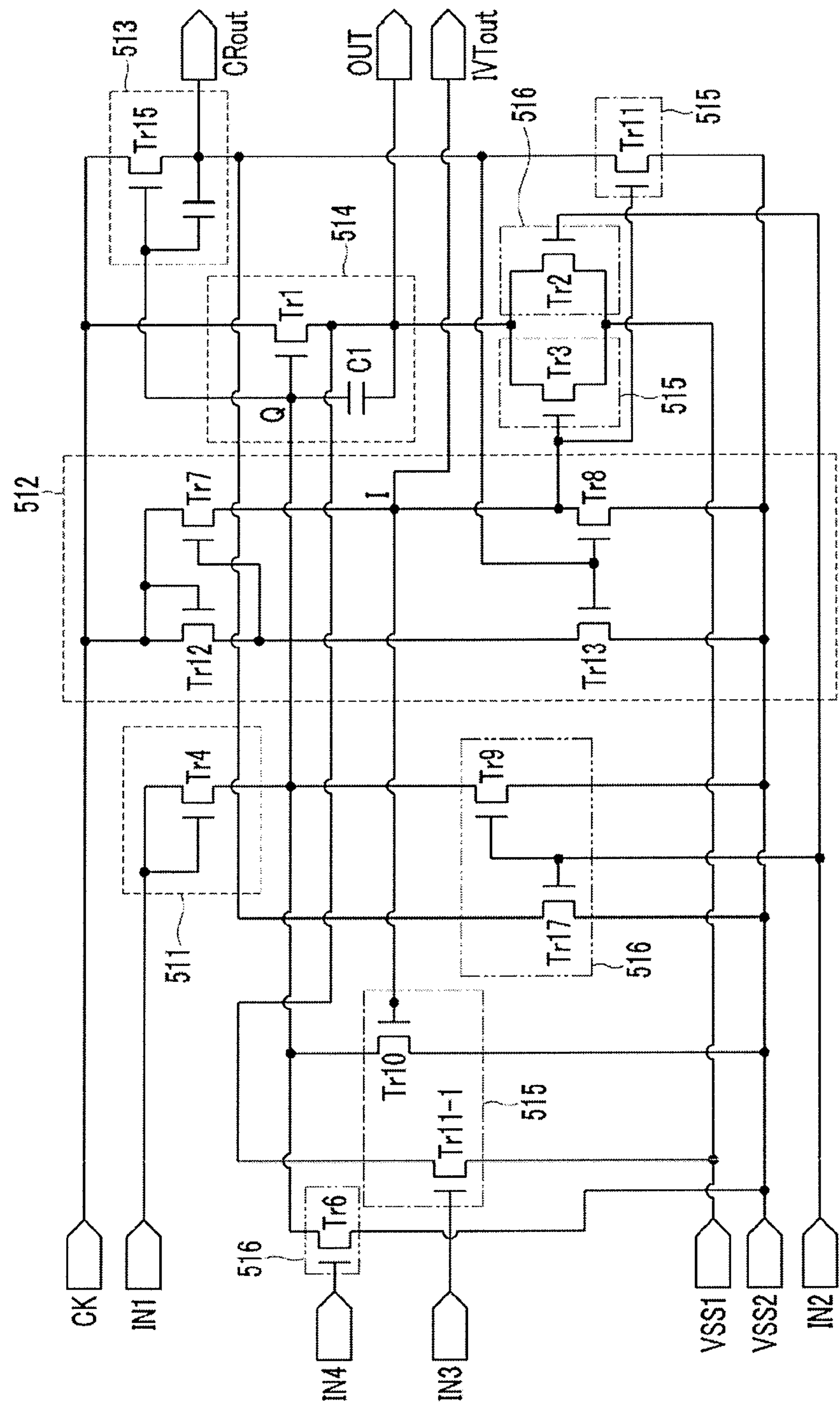

In the exemplary embodiment of FIG. 18, the ninth-1 and the tenth-1 transistors Tr9-1 and Tr10-1 are removed when compared with the exemplary embodiment of FIG. 14.

In other words, a pair of transistors that are additional connected to each other in the exemplary embodiment of FIG. 14 is replaced with a single transistor in the embodiment of FIG. 18. In FIG. 14, the pairs of transistors Tr9 and Tr9-1, and Tr10 and Tr10-1, are used to reduce the leakage current, but a pair of transistors are not always needed. For example, the single thin film transistor may have an increased channel width or length. Meanwhile, according to an exemplary embodiment, only one of the ninth-1 thin film transistor and the tenth-1 thin film transistor may be removed.

In the exemplary embodiment of FIG. 18, the output terminal of the ninth-1 transistor Tr9-1 may be connected to the first voltage input terminal Vin1 like in the exemplary embodiment of FIG. 15, or the seventeenth transistor Tr17 may be removed like in the exemplary embodiment of FIG. 16.

Figure 19:
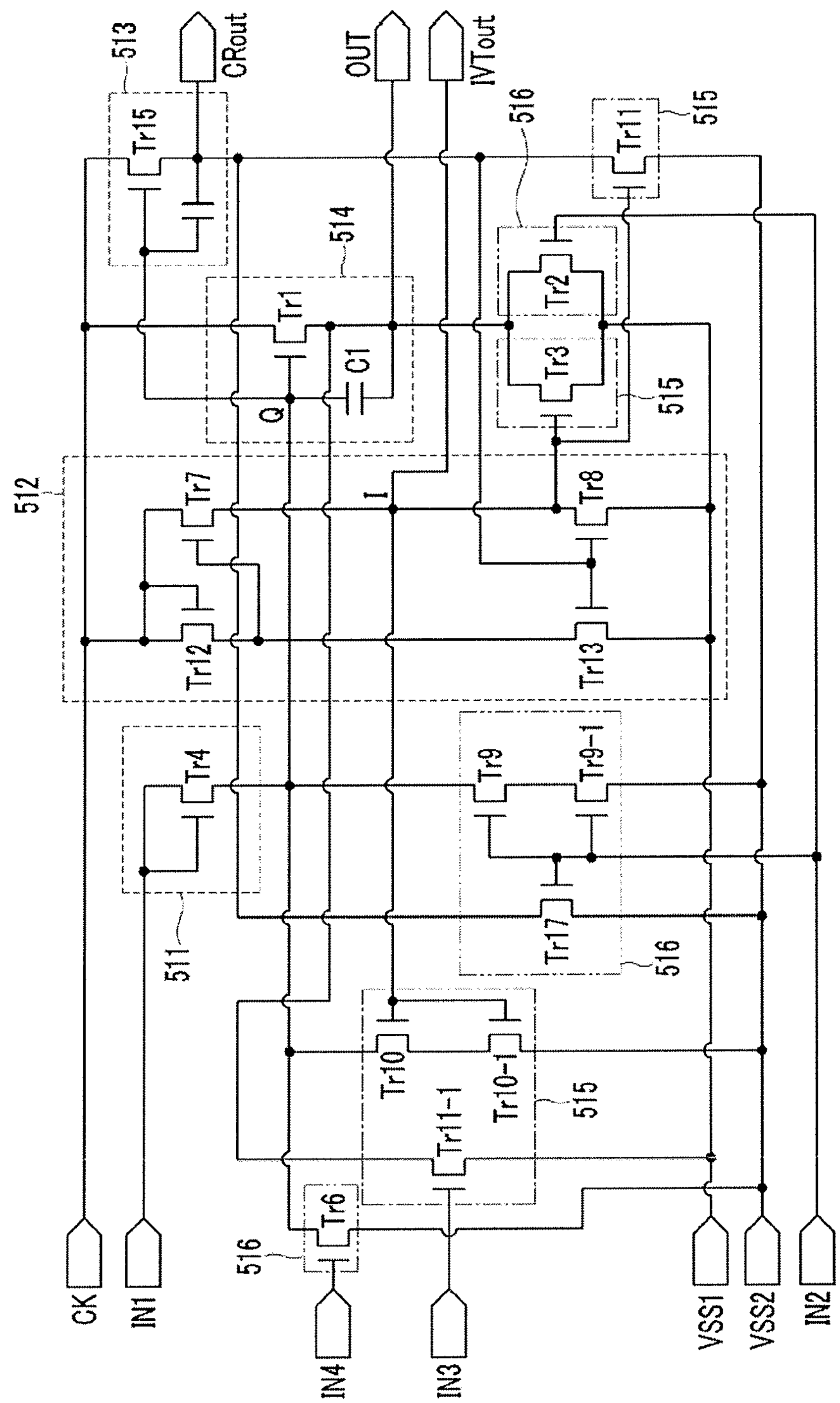

In the exemplary embodiment of FIG. 19, when compared with the exemplary embodiment of FIG. 14, the inverter unit 512 is connected not to the second low voltage Vss2 but to the first low voltage Vss1. The output terminals of the eighth and thirteenth transistors Tr8 and Tr13 of the inverter unit 512 are connected to the second voltage input terminal Vin2. In the exemplary embodiment of FIG. 17, the voltage of the node I is decreased to the first low voltage Vss1, and thus, a transistor having the control terminal receiving the voltage of the node I may be influenced. A voltage difference between the control terminal and the output terminal of the tenth and tenth-1 transistors Tr10 and Tr10-1 may be generated, and thus, the leakage current may be generated. A use of a transistor using a material other than the oxide semiconductor may avoid occurrence of the leakage current. Even when an oxide semiconductor transistor is used, no or little leakage current may be generated by improving the leakage current characteristics of the thin film transistor or by using a pair of transistors that are additional connected to each other as shown in FIG. 14. Therefore, when the stage shown in FIG. 19 is used, little or no leakage current may occur.

In the exemplary embodiment of FIG. 19, the output terminal of the ninth-1 transistor Tr9-1 may be connected to the first voltage input terminal Vin1 like in the exemplary embodiment of FIG. 15, the seventeenth transistor Tr17 may be removed like in the exemplary embodiment of FIG. 16, the ninth-1 or tenth-1 transistor Tr9-1 or Tr10-1 may be removed like in the exemplary embodiment of FIG. 17, or the output terminal of the eighth and thirteenth transistor Tr8 and Tr13 may be connected to the second voltage input terminal Vin2 like in the exemplary embodiment of FIG. 18.

According to an embodiment of the present invention, the above-described transistors may include an oxide semiconductor, amorphous silicon, or polysilicon.

The display device using two clock signals CKV and CKVB have been described.

However, according to an embodiment of the present invention, four or more clock signals (e.g., two pairs of clock signals) may be used in the display device.

A display device using four clock signals (e.g., two pairs of clock signals) are described with reference to FIG. 20 and FIG. 21.

Figure 20:
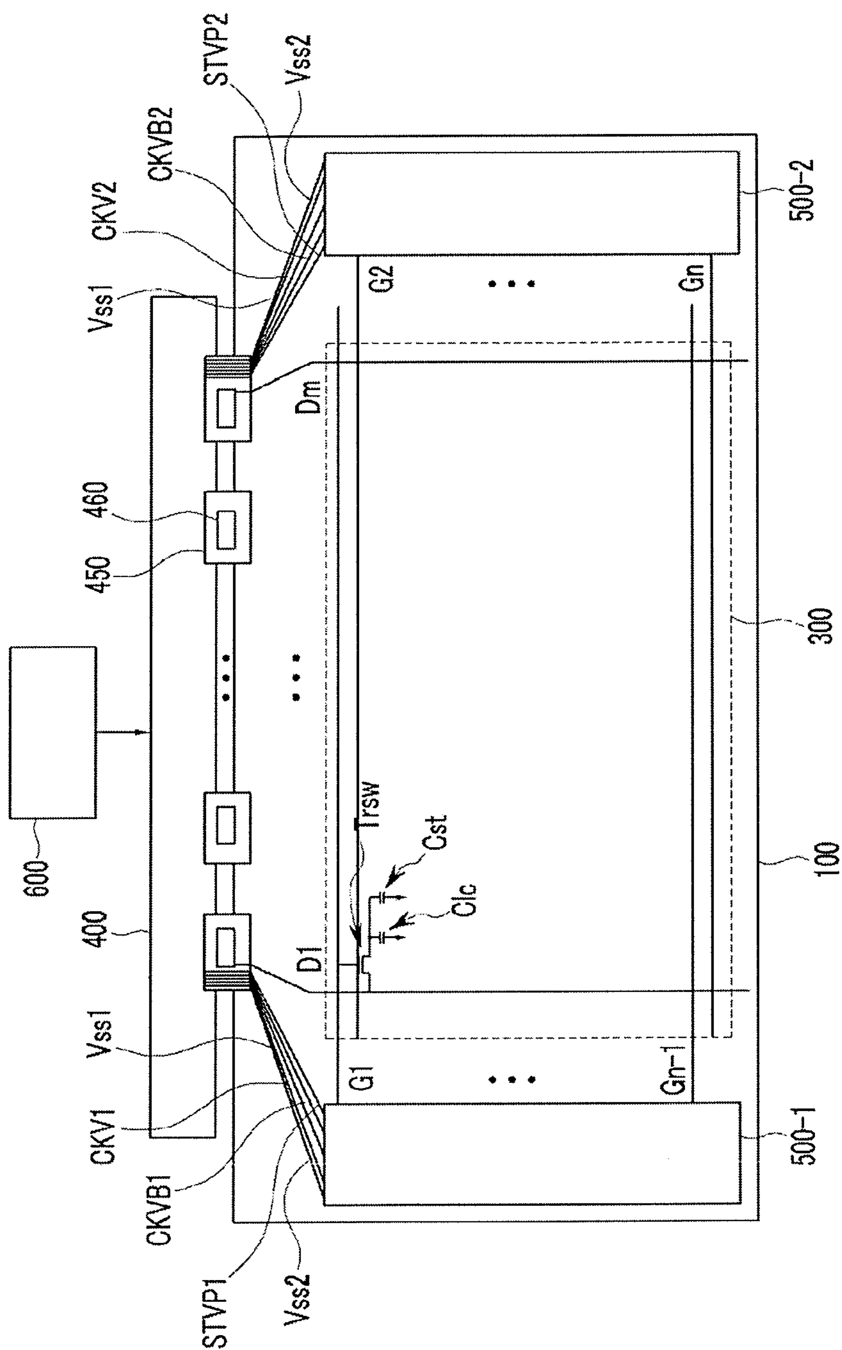
FIG. 20 is a top plan view illustrating a display device according to an exemplary embodiment of the present invention.
Figure 21:
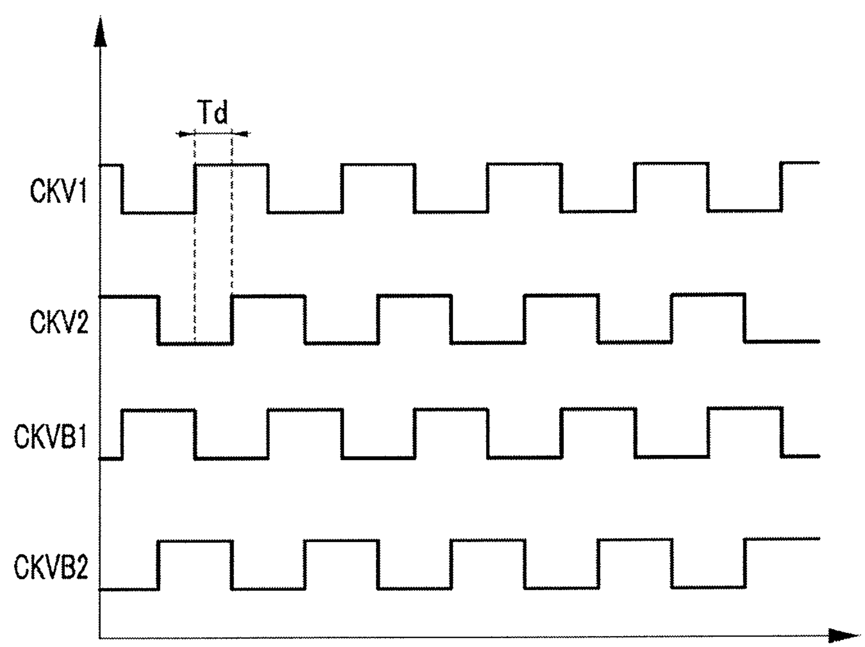
FIG. 21 is a waveform diagram illustrating clock signals used in the exemplary embodiment of FIG. 20.

FIG. 20 is a top plan view illustrating a display device according to an exemplary embodiment of the present invention, and FIG. 21 is a waveform diagram illustrating clock signals used in the exemplary embodiment of FIG. 20.

Referring to FIG. 20, the display panel 100 according to an exemplary embodiment of the present invention includes a display area 300 for displaying an image, and a pair of gate drivers 500-1 and 500-2 for applying gate voltages to gate lines of the display area 300. A data line of the display area 300 is applied with a data voltage from a data driver IC 460 formed on a film, such as a flexible printed circuit (FPC) film 450, attached to the display panel 100. The gate drivers 500-1 and 500-2, and the data driver IC 460, are controlled by a signal controller 600. A printed circuit board (PCB) is 400 formed outside the film, such as the flexible printed circuit film 450, and transmits a signal from the signal controller 600 to the data driver IC 460 and the gate drivers 500-1 and 500-2. Signals provided from the signal controller 600 may include a first clock signal CKV1, a second clock signal CKVB1, a third clock signal CKV2, a fourth clock signal CKVB2, scan start signals STVP1 and STVP2, and a signal for providing low voltages Vss1 and Vss2 of a predetermined level. According to an exemplary embodiment, the signal may provide a low voltage of only one kind. The first clock signal CKV1, the second clock signal CKVB1, the third clock signal CKV2, and the fourth clock signal CKVB2, respectively, may have phases as shown in FIG. 21.

When the display area 300 is a liquid crystal panel, the display area include a thin film transistor Trsw, a liquid crystal capacitor Clc, and a storage capacitor Cst, and FIG. 20 shows an example of the liquid crystal panel. On the other hand, the display area 300 for an organic light emitting panel may include a thin film transistor and an organic light emitting diode, and a display area 300 for other display panels includes elements such as thin film transistors. The present invention is not limited to the liquid crystal panel, however a liquid crystal panel will be described as an example for further clear description.

The display area 300 include a plurality of gate lines G1-Gn and a plurality of data lines D1-Dm, and the plurality of gate lines G1-Gn and the plurality of data lines D1-Dm are insulated from and intersect each other.

Each pixel PX includes a thin film transistor Trsw, a liquid crystal capacitor Clc, and a storage capacitor Cst. A control terminal of the thin film transistor Trsw is connected to a gate line, an input terminal of the thin film transistor Trsw is connected to a data line, and an output terminal of the thin film transistor Trsw is connected to a terminal of the liquid crystal capacitor Clc and a terminal of the storage capacitor. The other terminal of the liquid crystal capacitor Clc is connected to a common electrode, and the other terminal of the storage capacitor Cst is applied with a storage voltage Vcst applied from the signal controller 600. According to an embodiment of the present invention, he pixel PX of the liquid crystal panel may include an additional constitutional element.

The plurality of data lines D1-Dm receive data voltages from the data driver IC 460, and the plurality of gate lines G1-Gn receive gate voltages from the gate drivers 500-1 and 500-2. A plurality of gate lines G1-Gn are divided into odd-numbered gate lines and even-numbered gate lines. The odd-numbered gate lines are connected to the first gate driver 500-1, and the even-numbered gate lines are connected to the second gate driver 500-2.

The data driver IC 460 is formed at an upper or lower side of the display panel 100 and is connected to the data lines D1-Dm extending in a vertical direction. As shown in FIG. 20, the data driver IC 460 is positioned, for example, at the upper side of the display panel 100.

The first gate driver 500-1 receives the first clock signal CKV1, the second clock signal CKVB1, the first scan start signal STVP1, the first low voltage Vss1 corresponding to the gate-off voltage, and the second low voltage Vss2 that is lower than the gate-off voltage and generates gate voltages (a gate-on voltage and a gate-off voltage). The first gate driver 500-1 sequentially applies the gate-on voltage to the odd-numbered gate lines.

The second gate driver 500-2 receives the third clock signal CKV2, the fourth clock signal CKVB2, the second scan start signal STVP2, the first low voltage Vss1 corresponding to the gate-off voltage, and the second low voltage Vss2 that is lower than the gate-off voltage to generate gate voltages (a gate-on voltage and a gate-off voltage). The second gate driver 500-1 sequentially applies the gate-on voltage to the even-numbered gate lines.

As shown in FIG. 21, in an exemplary embodiment of the present invention, the first clock signal CKV1 and the second clock signal CKVB1 have a phase difference of about 180 degrees, and the third clock signal CKV2 and the fourth clock signal CKVB2 have a phase difference of about 180 degrees. The phase difference between the first clock signal CKV1 and the third clock signal CKV2 may vary according to an exemplary embodiment (Td of FIG. 21). In the exemplary embodiment of FIG. 21, the phase difference is 90 degrees.

As shown in FIG. 21, in relation to the first to fourth clock signals, periods during which the gate-on voltage is applied may partially overlap each other between gate lines adjacent to each other among the odd-numbered gate lines and the even-numbered gate lines. When a data voltage is applied to two neighboring pixel rows, the data voltage may be applied to one of the pixel rows (a previous pixel row), and the other pixel row (a subsequent pixel row) may be pre-charged.

The clock signals CKV1, CKVB1, CKV2, and CKVB2, the scan start signals STVP1 and STVP2, the first low voltage Vss1, and the second low voltage Vss2 that are applied to the gate drivers 500-1 and 500-2 are applied to the gate drivers 500-1 and 500-2 through the flexible printed circuit film 450 closest to the gate drivers 500-1 and 500-2 among the flexible printed circuit films 450 including the data drivers IC 460 as shown in FIG. 20. The signals are transmitted to the flexible printed circuit film 450 through the printed circuit board (PCB) 400 from the outside, or the signal controller 600.

The first and second gate drivers 500-1 and 500-2 shown in FIG. 20 may include the same or substantially the same structure as shown in FIG. 2 or FIG. 13, and each stage of the first and second gate drivers 500-1 and 500-2 may include the same or substantially the same structure as shown in FIG. 3, FIG. 8 to FIG. 12, or FIG. 14 to FIG. 19.

While embodiments of the invention have been described, it is to be understood that the invention is not limited to the embodiments, and various modifications may be made to the embodiments of the present invention.

What is claimed is:

1. A display device comprising:

a display area comprising a gate line and a data line; and a gate driver connected to an end of the gate line, the gate driver comprising at least one stage integrated on a substrate and configured to output a gate voltage, wherein the stage comprises an output unit and a noise removal unit, wherein the output unit comprises a first transistor and a first capacitor, wherein the first transistor includes an input terminal applied with a clock signal, a control terminal connected to a first node, and an output terminal connected to a gate voltage output terminal through which the gate voltage is output, wherein a voltage of the first node is lower than the gate voltage output by the output unit, and wherein the noise removal unit comprises at least one transistor comprising a control terminal connected to a second node of a previous stage, an input terminal connected to the gate voltage output terminal, and an output terminal connected to a first low voltage.

2. The display device of claim 1, wherein the stage comprises an inverter unit comprising at least two transistors connected to the second node.

3. The display device of claim 2, wherein the noise removal unit further comprises at least a first transistor pair, wherein the first transistor pair comprises a control terminal connected to the second node, an input terminal connected to the first node, and an output terminal connected to a second low voltage.

4. The display device of claim 3, wherein the stage further comprises a pull-down unit having at least a second transistor pair, wherein the second transistor pair comprises a control terminal configured to receive an output of a next stage, an input terminal connected to the first node, and an output terminal connected to the second low voltage.

5. The display device of claim 4, wherein the stage further comprises a transmitting signal generator having at least one transistor comprising an input terminal configured to receive the clock signal, a control terminal connected to the first node, and an output terminal connected to a transmitting signal output terminal configured to output a transmitting signal.

6. The display device of claim 5, wherein the pull-down unit further comprises at least one transistor comprising a control terminal configured to receive an output of a next stage, an input terminal connected to the transmitting signal output terminal, and an output terminal connected to the second low voltage.

7. The display device of claim 6, wherein the pull-down unit further comprises at least one transistor configured to receive an output of a second next stage and comprising an input terminal connected to the first node and an output terminal connected to the second low voltage.

8. The display device of claim 7, wherein at least one of the transistors comprises an oxide semiconductor.

9. The display device of claim 3, wherein the stage further comprises a pull-down unit comprising at least a transistor pair having a control terminal configured to receive an output of a next stage, an input terminal connected to the first node, and an output terminal connected to the first low voltage.

10. The display device of claim 3, wherein the stage further comprises a pull-down unit comprising at least one transistor comprising a control terminal configured to receive an output of a next stage, an input terminal connected to the first node, and an output terminal connected to the second low voltage.

11. The display device of claim 3, wherein the stage further comprises a pull-down unit comprising at least one transistor having a control terminal configured to receive an output of a next stage, an input terminal connected to the first node, and an output terminal connected to the first low voltage.

12. The display device of claim 2, wherein the noise removal unit further comprises at least one transistor comprising a control terminal connected to the second node, an input terminal connected to the first node, and an output terminal connected to the second low voltage.

13. The display device of claim 12, wherein the stage further comprises a pull-down unit comprising at least a transistor pair including a control terminal configured to receive an output of a next stage, an input terminal connected to the first node, and an output terminal connected to the second low voltage.

14. The display device of claim 13, wherein the stage further comprises a transmitting signal generator comprising at least one transistor including an input terminal applied with the clock signal, a control terminal connected to the first node, and an output terminal connected to a transmitting signal output terminal configured to output a transmitting signal.

15. The display device of claim 14, wherein the pull-down unit further comprises at least one transistor comprising a control terminal configured to receive an output of a next stage, an input terminal connected to the transmitting signal output terminal, and an output terminal connected to the second low voltage.

16. The display device of claim 15, wherein the pull-down unit further comprises at least one transistor configured to receive an output of a second next stage and comprising an input terminal connected to the first node and an output terminal connected to the second low voltage.

17. The display device of claim 16, wherein at least one of the transistors comprises an oxide semiconductor.

18. The display device of claim 12, wherein the stage further comprises a pull-down unit comprising at least a transistor pair having a control terminal configured to receive an output of a next stage, an input terminal connected to the first node, and an output terminal connected to the first low voltage.

19. The display device of claim 12, wherein the stage further comprises a pull-down unit comprising at least one transistor comprising a control terminal configured to receive an output of a next stage, an input terminal connected to the first node, and an output terminal connected to the second low voltage.

20. The display device of claim 12, wherein the stage further comprises a pull-down unit comprising at least one transistor having a control terminal configured to receive an output of a next stage, an input terminal connected to the first node, and an output terminal connected to the first low voltage.

* * * * *